(12) United States Patent
Jun et al.

(10) Patent No.: US 10,043,797 B2
(45) Date of Patent: Aug. 7, 2018

(54) TECHNIQUES FOR FORMING VERTICAL TRANSISTOR ARCHITECTURES

(71) Applicant: INTEL CORPORATION, Santa Clara, CA (US)

(72) Inventors: Kimin Jun, Hillsboro, OR (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/124,808

(22) PCT Filed: Jun. 23, 2014

(86) PCT No.: PCT/US2014/043683
§ 371 (c)(1),
(2) Date: Sep. 9, 2016

(87) PCT Pub. No.: WO2015/199644
PCT Pub. Date: Dec. 30, 2015

(65) Prior Publication Data
US 2017/0025412 A1   Jan. 26, 2017

(51) Int. Cl.
*H01L 29/00* (2006.01)
*H01L 27/088* (2006.01)
(Continued)

(52) U.S. Cl.
CPC .... *H01L 27/088* (2013.01); *H01L 21/823475* (2013.01); *H01L 21/823487* (2013.01);
(Continued)

(58) Field of Classification Search
CPC ........... H01L 29/42392; H01L 29/7926; H01L 29/66545; H01L 29/775; H01L 27/0688
See application file for complete search history.

(56) References Cited

U.S. PATENT DOCUMENTS

| 2005/0253143 A1 | 11/2005 | Takaura et al. |
| 2007/0075359 A1 | 4/2007 | Yoon et al. |

(Continued)

FOREIGN PATENT DOCUMENTS

| JP | H07321228 A | 12/1995 |
| JP | H10229175 A | 8/1998 |

(Continued)

OTHER PUBLICATIONS

International Search Report and Written Opinion received in PCT Application No. PCT/US14/043683, dated Mar. 26, 2015. 14 pages.
(Continued)

*Primary Examiner* — Ngan Ngo
(74) *Attorney, Agent, or Firm* — Finch & Maloney PLLC

(57) ABSTRACT

Techniques are disclosed for forming vertical transistor architectures. In accordance with some embodiments, a semiconductor layer is disposed over a lower interconnect layer and patterned into a plurality of vertical semiconductor bodies (e.g., nanowires and/or other three-dimensional semiconductor structures) in a regular, semi-regular, or irregular array, as desired for a given target application or end-use. Thereafter, a gate layer surrounding the active channel portion of each (or some sub-set) of the vertical semiconductor bodies is formed, followed by an upper interconnect layer, in accordance with some embodiments. During processing, a given vertical semiconductor body optionally may be removed and, in accordance with some embodiments, either: (1) blanked to provide a dummy channel; or (2) replaced with an electrically conductive plug to provide a via or other inter-layer routing. Processing can be performed in multiple iterations, for example, to provide multi-level/stacked vertical transistor circuit architectures of any standard and/or custom configuration.

25 Claims, 9 Drawing Sheets

(51) Int. Cl.

| | |
|---|---|
| *H01L 29/775* | (2006.01) |
| *H01L 27/06* | (2006.01) |
| *H01L 29/66* | (2006.01) |
| *H01L 29/423* | (2006.01) |
| *H01L 29/792* | (2006.01) |
| *H01L 21/8234* | (2006.01) |
| *H01L 21/8238* | (2006.01) |
| *H01L 23/528* | (2006.01) |
| *H01L 27/092* | (2006.01) |
| *H01L 29/06* | (2006.01) |
| *H01L 29/78* | (2006.01) |

(52) U.S. Cl.
CPC ........... *H01L 21/823871* (2013.01); *H01L 21/823885* (2013.01); *H01L 23/528* (2013.01); *H01L 27/0688* (2013.01); *H01L 27/092* (2013.01); *H01L 29/0676* (2013.01); *H01L 29/42392* (2013.01); *H01L 29/66545* (2013.01); *H01L 29/66666* (2013.01); *H01L 29/775* (2013.01); *H01L 29/7827* (2013.01); *H01L 29/7926* (2013.01)

(56) References Cited

U.S. PATENT DOCUMENTS

| | | |
|---|---|---|
| 2008/0048327 A1 | 2/2008 | Lee |
| 2008/0090401 A1 | 4/2008 | Bratkovski et al. |
| 2009/0057722 A1 | 3/2009 | Masuoka et al. |
| 2010/0038709 A1 | 2/2010 | Wang et al. |
| 2010/0203695 A1 | 8/2010 | Oh et al. |
| 2011/0062510 A1* | 3/2011 | Joo ............... H01L 27/11578 257/324 |
| 2012/0052674 A1* | 3/2012 | Lee ............... H01L 27/11578 438/591 |
| 2013/0015500 A1 | 1/2013 | Izumida et al. |
| 2013/0069149 A1 | 3/2013 | Masuoka et al. |
| 2013/0128660 A1* | 5/2013 | Yoo ............... G11C 16/26 365/185.02 |
| 2013/0240983 A1 | 9/2013 | Larrieu |
| 2013/0307056 A1* | 11/2013 | Takaishi ......... H01L 29/7802 257/329 |
| 2013/0307513 A1* | 11/2013 | Then ............... H01L 29/66469 323/311 |
| 2013/0313525 A1 | 11/2013 | Rosaz et al. |
| 2013/0334589 A1* | 12/2013 | Ahn ............... H01L 29/7926 257/324 |
| 2014/0035041 A1* | 2/2014 | Pillarisetty ...... H01L 21/845 257/365 |
| 2014/0084364 A1* | 3/2014 | Taniguchi ....... H01L 29/7827 257/330 |
| 2014/0103417 A1* | 4/2014 | Lee ............... H01L 27/11556 257/324 |
| 2014/0112049 A1* | 4/2014 | Jung ............... H01L 29/66833 365/72 |
| 2014/0166981 A1* | 6/2014 | Doyle ............. H01L 29/66666 257/24 |
| 2014/0170821 A1* | 6/2014 | Nyhus ............ H01L 29/66666 438/268 |
| 2014/0284694 A1* | 9/2014 | Kitazaki ......... H01L 29/66833 257/324 |
| 2014/0334230 A1* | 11/2014 | Kwon ............. H01L 27/11582 365/185.11 |
| 2015/0091186 A1* | 4/2015 | Yang .............. H01L 23/481 257/774 |
| 2015/0357432 A1* | 12/2015 | Lin ................. H01L 29/66439 257/24 |
| 2017/0047376 A1* | 2/2017 | Kurotsuchi ..... H01L 27/249 |
| 2017/0092781 A1* | 3/2017 | Polishchuk ..... H01L 29/7923 |
| 2017/0236757 A1* | 8/2017 | Nyhus ............ H01L 21/823487 257/329 |

FOREIGN PATENT DOCUMENTS

| | | |
|---|---|---|
| JP | 2003224211 A | 8/2003 |
| JP | 2008205168 A | 9/2008 |
| JP | 2009279750 A | 12/2009 |
| JP | 2012151169 A | 8/2012 |
| JP | 2014093319 A | 5/2014 |
| TW | I419329 B | 12/2013 |
| TW | I435448 B | 4/2014 |
| TW | I440099 B | 6/2014 |
| WO | 2013038553 A1 | 3/2015 |
| WO | 2015199644 A1 | 12/2015 |

OTHER PUBLICATIONS

Taiwan Office Action and Search Report received for Taiwan Application No. 104115590, dated Aug. 25, 2016. 10 pages.
International Preliminary Report on Patentability received in PCT Application No. PCT/US14/043681 dated Dec. 27, 2016. 9 pages.
Dumé, Belle, "Nanowires give vertical transistors a boost," physicsworld.com, Aug. 2, 2012. 2 pages.
"High, not flat: nanowires for a new chip architecture," FZD press release published on Feb. 2, 2010. 3 pages.
Goldberger, et al., "Silicon Vertically Integrated Nanowire Field Effect Transistors," Nano Letters, 2006, vol. 6, No. 5. pp. 973-977.
Hellemans, Alexander, "Nanowire Transistors Could Keep Moore's Law Alive," Apr. 29, 2011 2 pages.
Larrieu, et al., "Vertical nanowire array-based field effect transistors for ultimate scaling," Nanoscale, Issue 6, vol. 5, Jan. 23, 2013, 2pages.
Tomioka, et al., "A III-V nanowire channel on silicon for high-performance vertical transistors," Nature Letter, vol. 488, issue 7410, Aug. 1, 2012. 6 pages.
Extended European Search Report received for EP Application No. 14895514.9, dated Dec. 15, 2017. 10 pages.
Notification of Reasons for Refusal received for JP Application No. 2016-567589, dated Apr. 3, 2018, 5 pages.

* cited by examiner

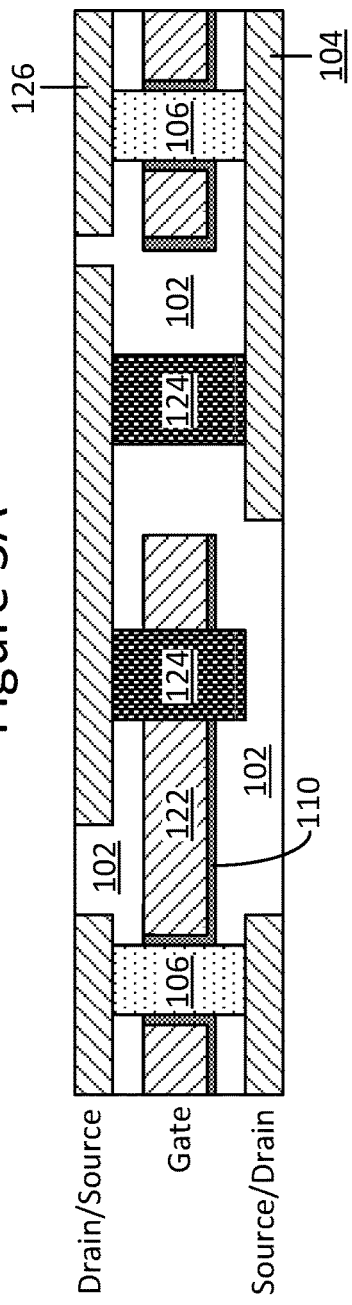
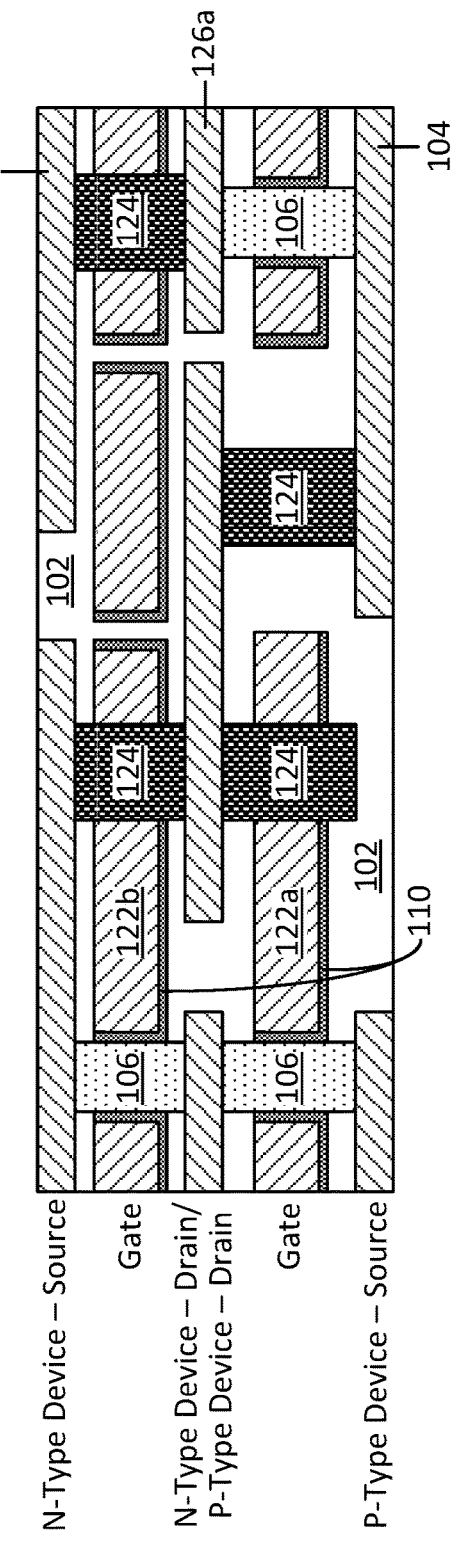

US 10,043,797 B2

TECHNIQUES FOR FORMING VERTICAL TRANSISTOR ARCHITECTURES

BACKGROUND

In a typical vertical transistor architecture, each conducting channel is provided by a silicon nanowire that is oriented perpendicularly with respect to the plane of an underlying semiconductor substrate. Each vertical channel is wrapped with a three-dimensional metal gate in a so-called gate-all-around (GAA) configuration, and source and drain contacts are electrically coupled with the ends of each vertical channel.

BRIEF DESCRIPTION OF THE DRAWINGS

FIG. 1A' illustrates a three-dimensional perspective view of the IC of FIG. 1A.

FIG. 1C' illustrates a three-dimensional perspective view of the IC of FIG. 1C.

FIG. 1E' illustrates a three-dimensional perspective view of the IC 100 of FIG. 1E.

FIG. 1H' illustrates a three-dimensional perspective view of the IC of FIG. 1H.

FIG. 1K' illustrates a three-dimensional perspective view of the IC of FIG. 1K.

FIG. 1M' illustrates a three-dimensional perspective view of the IC of FIG. 1M.

FIG. 1N' illustrates a three-dimensional perspective view of the IC of FIG. 1N.

FIG. 3A is a cross-sectional view of an example IC configured in accordance with another embodiment of the present disclosure.

FIG. 3B is a cross-sectional view of an example IC configured in accordance with another embodiment of the present disclosure.

Figure 1A:
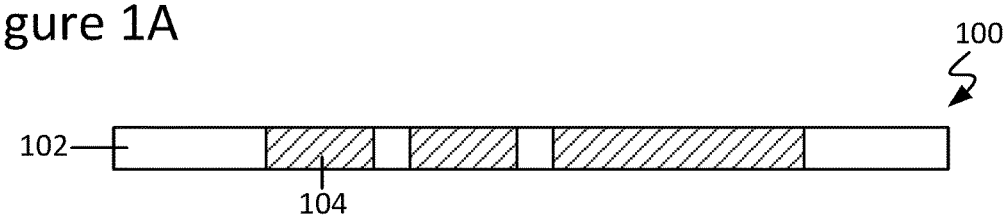
FIG. 1A is a cross-sectional view of an integrated circuit (IC) configured in accordance with an embodiment of the present disclosure.
Figure 1A:
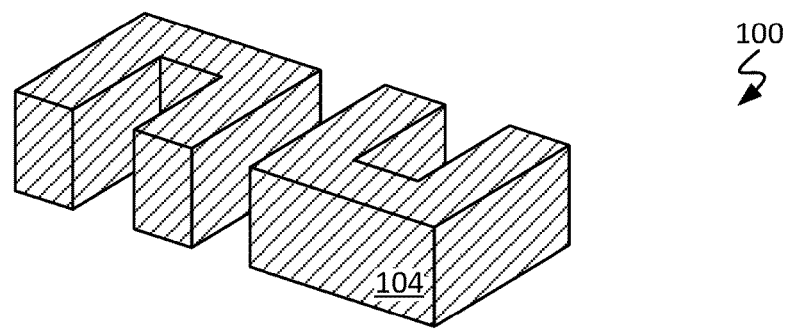

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines, right angles, etc., and some features may have surface topography or otherwise be non-smooth, given real-world limitations of fabrication processes. In short, the figures are provided merely to show example structures.

DETAILED DESCRIPTION

Techniques are disclosed for forming vertical transistor architectures. In accordance with some embodiments, a semiconductor layer is disposed over a lower interconnect layer and then patterned into a plurality of vertical semiconductor bodies (e.g., nanowires and/or other three-dimensional semiconductor structures) in a regular, semi-regular, or irregular array, as desired for a given target application or end-use. Thereafter, a gate layer surrounding the active channel portion of each vertical semiconductor body of the array (or some sub-set thereof) is formed, followed by an upper interconnect layer, in accordance with some embodiments. During processing, a given vertical semiconductor body optionally may be removed and, in accordance with some embodiments, either: (1) blanked to provide a dummy channel; or (2) replaced with an electrically conductive plug to provide a via or other inter-layer routing. Processing can be performed in multiple iterations, for example, to provide multi-level/stacked vertical transistor architectures of any standard and/or custom configuration. In accordance with some embodiments, the techniques disclosed herein can be utilized, for example, in forming single vertical channel devices, as well as in special-purpose circuit fabrication (e.g., including multiple levels of semiconductor channels and routings, such as memory bitcell arrays or logic gates). Numerous configurations and variations will be apparent in light of this disclosure.

General Overview

Planar (horizontal channel) transistor devices face limitations with respect to scaling down in size and with respect to integration in microchips. Vertical transistor devices may provide a desirable alternative for next-generation microelectronics. However, vertical transistor architectures pose a variety of processing complications that existing integrated fabrication methodologies do not adequately address or otherwise acknowledge. For instance, traditional vertical transistor architectures typically include at least three routing layers: (1) a lower source/drain layer below the vertical channel; (2) a gate at the same level as the vertical channel; and (3) an upper drain/source layer above the vertical channel. Given their positioning relative to one another, the lower routing layer in vertical transistor architectures is normally required to be fabricated prior to fabricating the vertical channel, and as such, existing bulk processing approaches generally are not compatible. Furthermore, as the gate in traditional horizontal channel devices is typically configured to serve as a local interconnect, it may be desirable to configure the gate of a vertical channel device to similarly serve as a local interconnect, for example, to provide for design compatibility between horizontal and vertical devices. However, given that the gate in a vertical transistor is located at the same level as the vertical channel, existing invasive processing approaches risk damage to the vertical channel device during formation.

Thus, and in accordance with some embodiments of the present disclosure, techniques are disclosed for forming vertical transistor architectures. In accordance with some embodiments, a semiconductor layer is disposed over a lower interconnect layer and then patterned into a plurality of vertical semiconductor bodies (e.g., nanowires and/or other three-dimensional semiconductor structures) in a regular, semi-regular, or irregular array, as desired for a given target application or end-use. Thereafter, a gate layer surrounding the active channel portion of each vertical semiconductor body of the array (or some sub-set thereof) is formed, followed by an upper interconnect layer, in accordance with some embodiments. During processing, a given vertical semiconductor body optionally may be removed and, in accordance with some embodiments, either: (1) blanked at that location to provide a dummy channel; or (2) replaced at that location with an electrically conductive plug to provide a via or other inter-layer routing. Processing can be performed in multiple iterations, for example, to provide multi-level/stacked vertical transistor architectures of any standard and/or custom configuration. In accordance with some embodiments, the techniques disclosed herein can be utilized, for example, in forming single vertical channel transistor devices, as well as in higher level circuits including multiple levels of semiconductor channels and routings, as desired.

In accordance with some embodiments, the disclosed techniques can be utilized, for example, to provide a given vertical channel device with any desired arrangement of electrical connections (e.g., source to gate; drain to gate; source to drain; source to gate to drain). In some cases, the disclosed techniques can be utilized, for example, to provide a vertical channel architecture including a gate layer configured, in accordance with an embodiment, to serve as a local interconnect for a host IC. In accordance with some embodiments, techniques disclosed herein can be utilized, for example, in forming traditional as well as advanced vertical metal-oxide-semiconductor (MOS) devices, such as tunnel field-effect transistor (TFET) devices, quantum superlattices, and other heterostructures that typically exhibit sharp and precise construction. Use of the disclosed techniques may be detected, for example, by visual or other inspection (e.g., microscope, etc.) of a given semiconductor architecture (or other IC) having one or more vertical transistor devices configured as described herein, in accordance with some embodiments.

Methodology and Structure

Figure 1B:
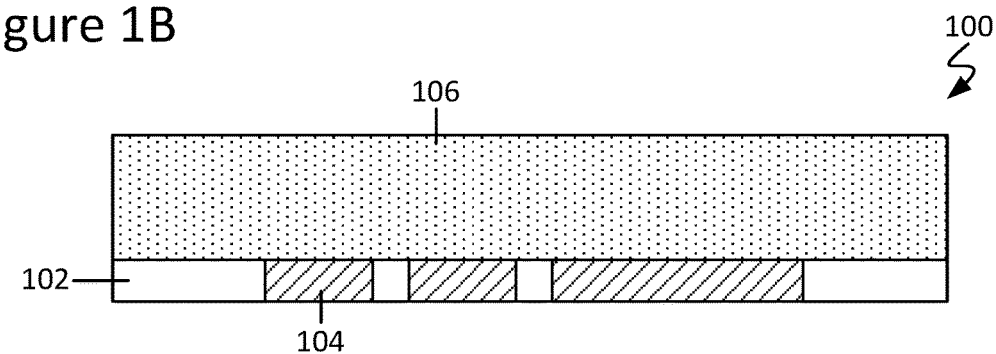
FIG. 1B is a cross-sectional view of the IC of FIG. 1A after transfer of a semiconductor layer thereto, in accordance with an embodiment of the present disclosure.
Figure 1C:
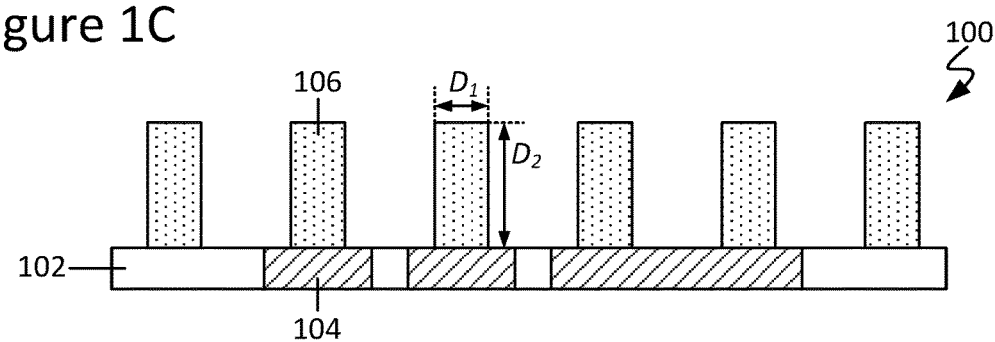
FIG. 1C is a cross-sectional view of the IC of FIG. 1B after patterning the semiconductor layer, in accordance with an embodiment of the present disclosure.
Figure 1C:
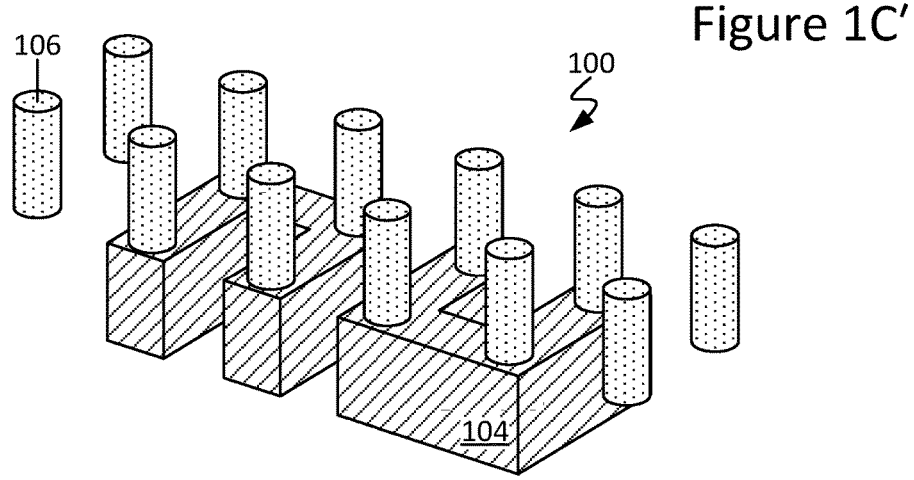
Figure 1D:
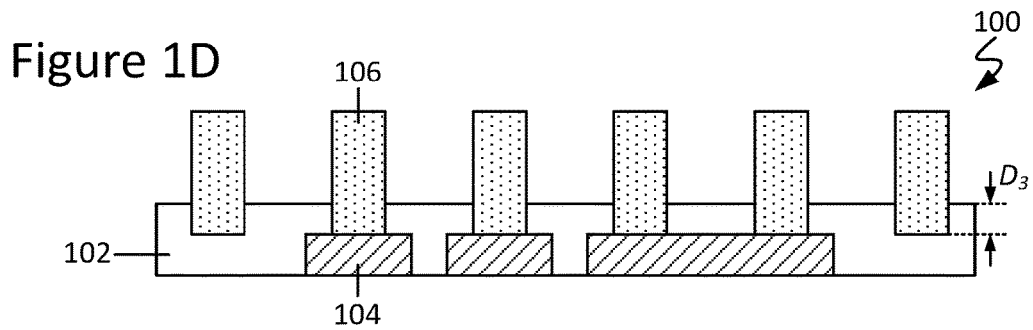
FIG. 1D is a cross-sectional view of the IC of FIG. 1C after further formation of the dielectric layer or so-called inter-layer dielectric (ILD), in accordance with an embodiment of the present disclosure.
Figure 1E:
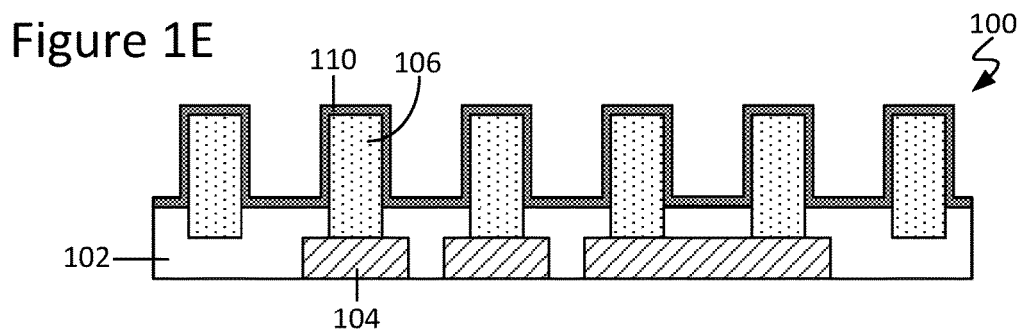
FIG. 1E is a cross-sectional view of the IC of FIG. 1D after formation of a second dielectric layer or so-called gate dielectric, in accordance with an embodiment of the present disclosure.
Figure 1E:
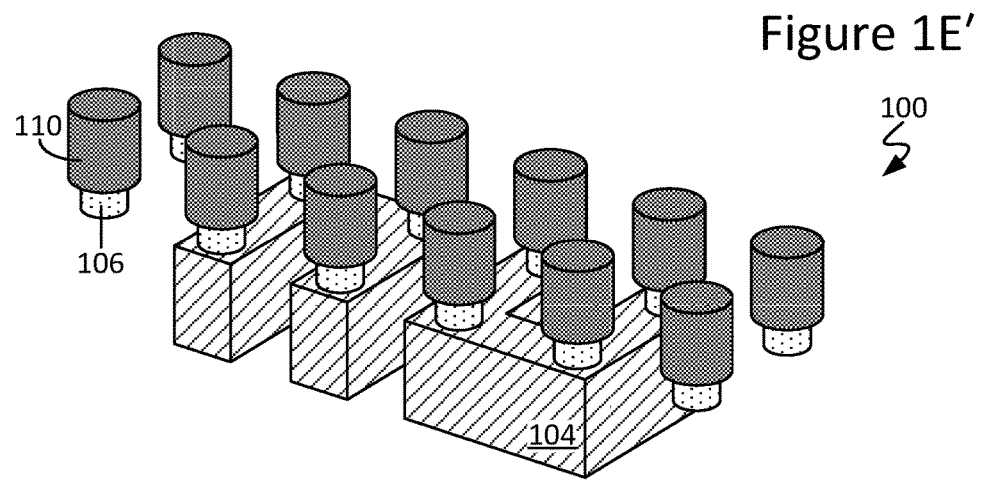
Figure 1F:
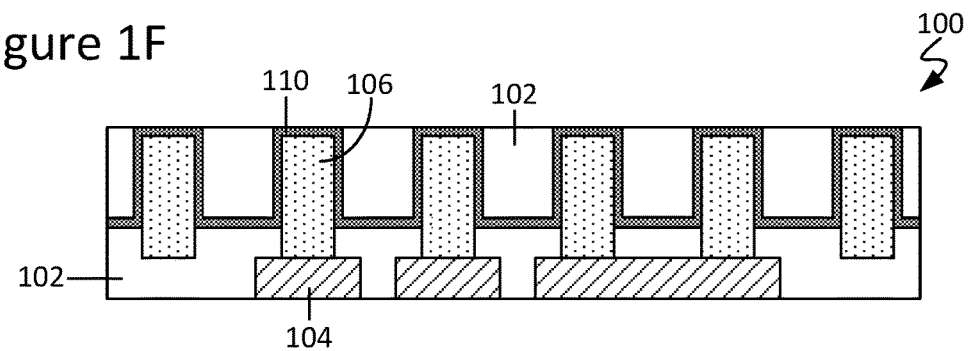
FIG. 1F is a cross-sectional view of the IC of FIG. 1E after further formation of the ILD and planarization, in accordance with an embodiment of the present disclosure.
Figure 1G:
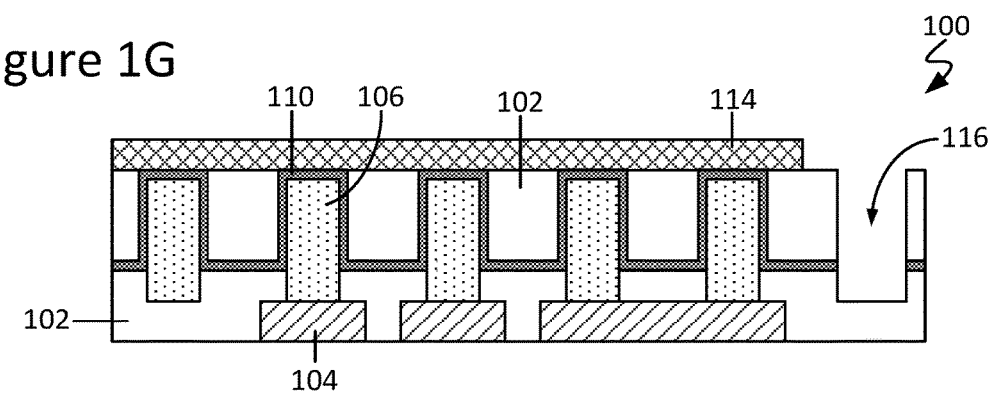
FIG. 1G is a cross-sectional view of the IC of FIG. 1F after formation and patterning of a hardmask layer and patterning of the IC therewith, in accordance with an embodiment of the present disclosure.
Figure 1H:
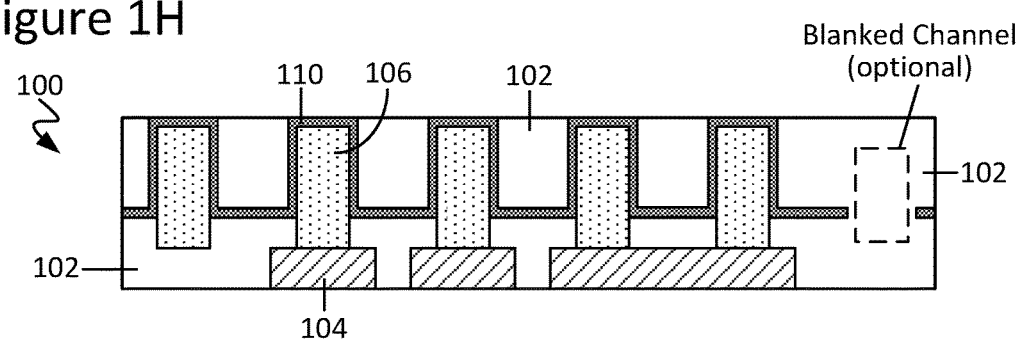
FIG. 1H is a cross-sectional view of the IC of FIG. 1G after removal of the hardmask layer, further formation of the ILD, and planarization, in accordance with an embodiment of the present disclosure.
Figure 1H:
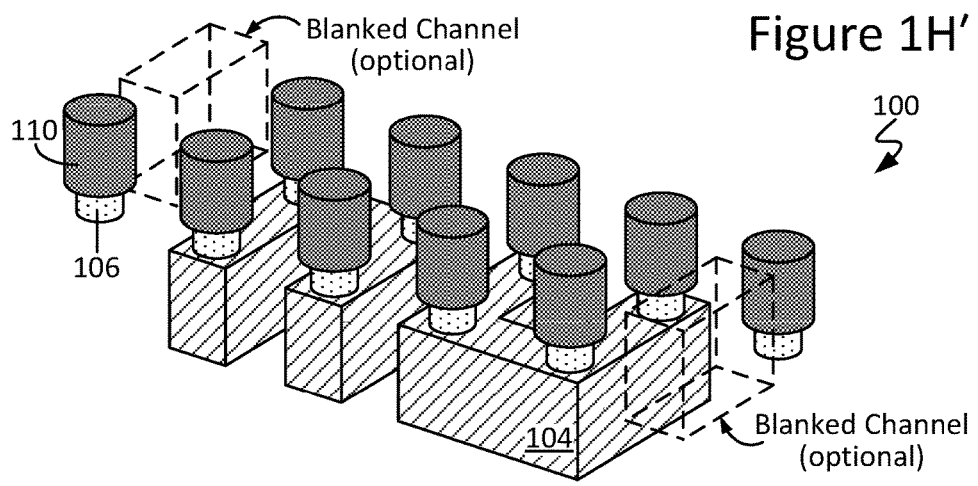
Figure 1I:
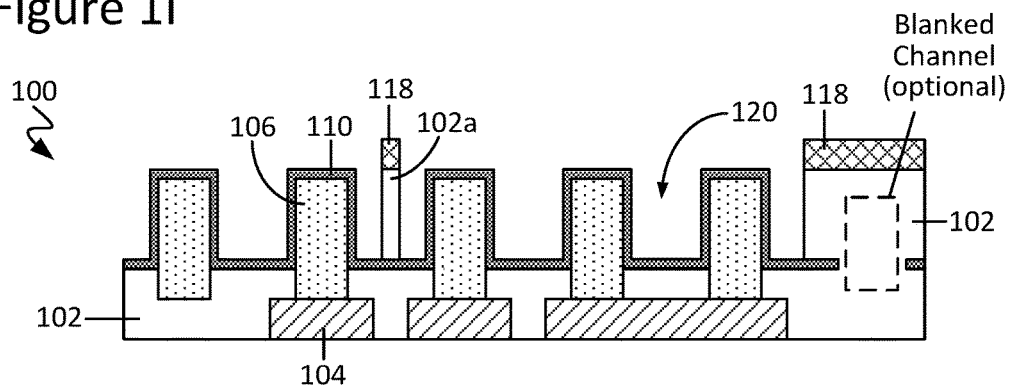
FIG. 1I is a cross-sectional view of the IC of FIG. 1H after formation and patterning of a second hardmask layer and patterning of the IC therewith, in accordance with an embodiment of the present disclosure.
Figure 1J:
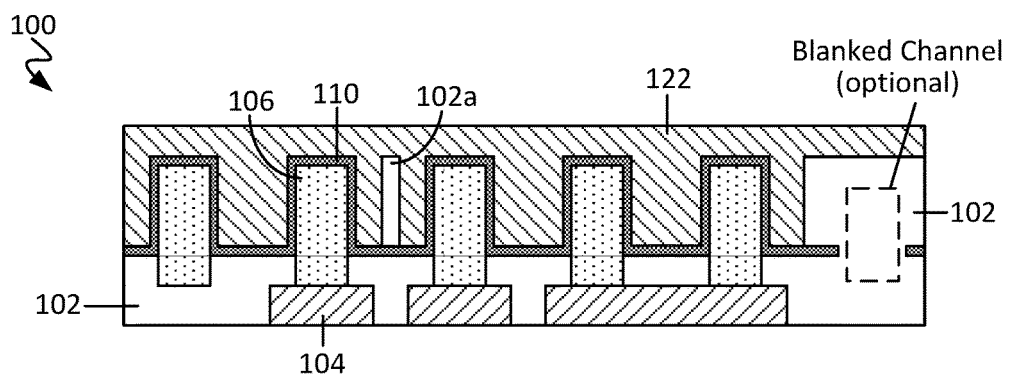
FIG. 1J is a cross-sectional view of the IC of FIG. 1I after formation of a gate layer, in accordance with an embodiment of the present disclosure.
Figure 1K:
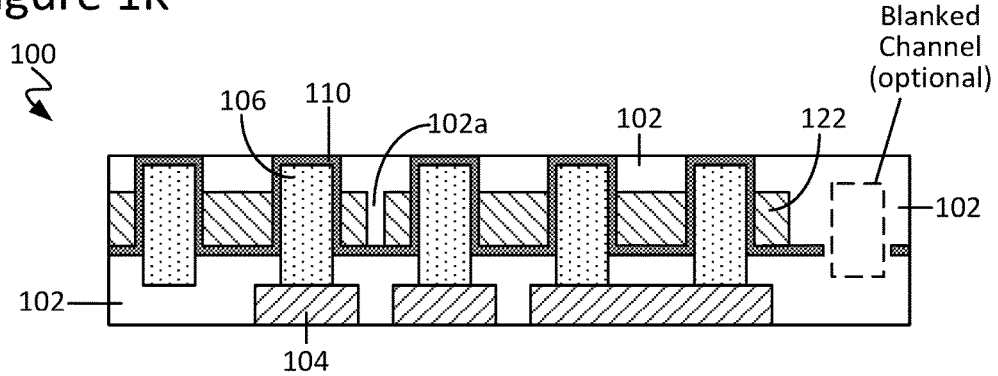
FIG. 1K is a cross-sectional view of the IC of FIG. 1J after recessing the gate layer, in accordance with an embodiment of the present disclosure.
Figure 1K:
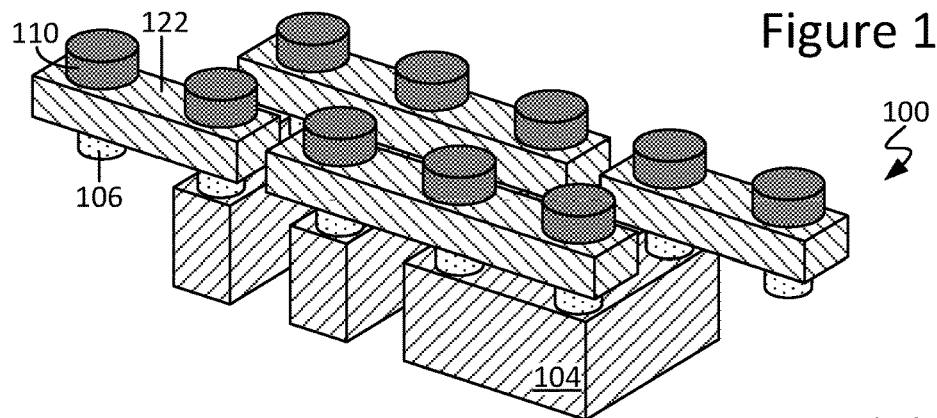
Figure 1L:
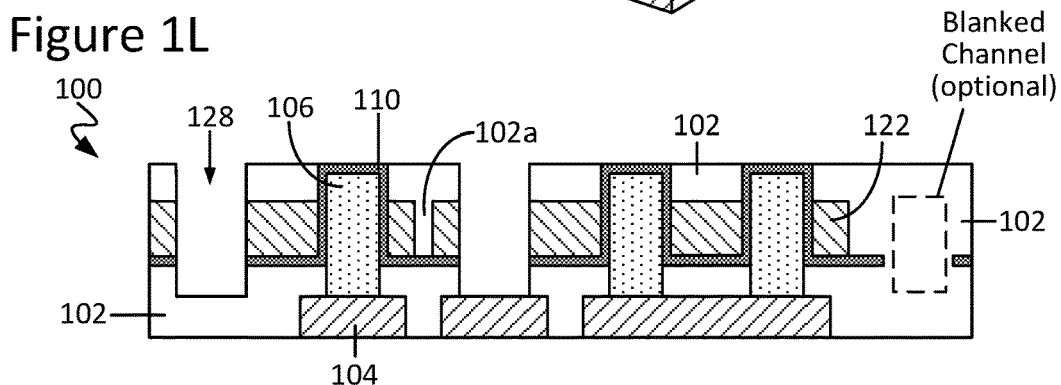
FIG. 1L is a cross-sectional view of the IC of FIG. 1K after patterning, in accordance with an embodiment of the present disclosure.
Figure 1M:
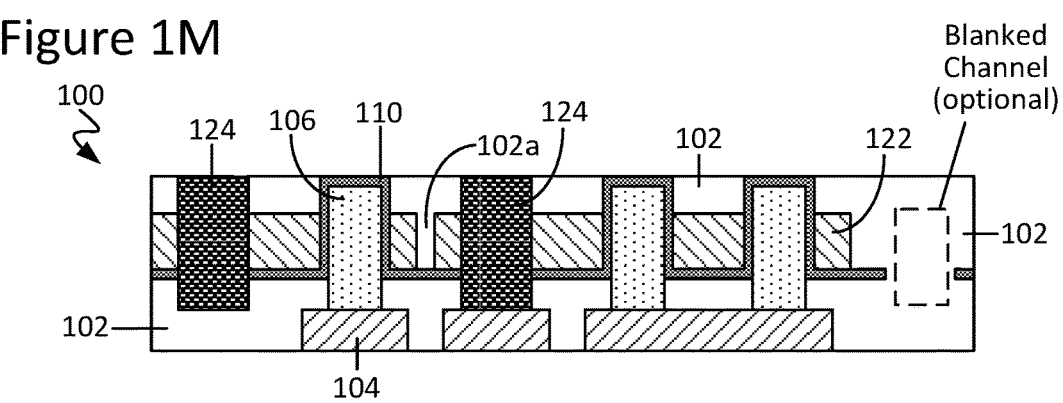
FIG. 1M is a cross-sectional view of the IC of FIG. 1L after formation of one or more electrically conductive plugs, in accordance with an embodiment of the present disclosure.
Figure 1M:
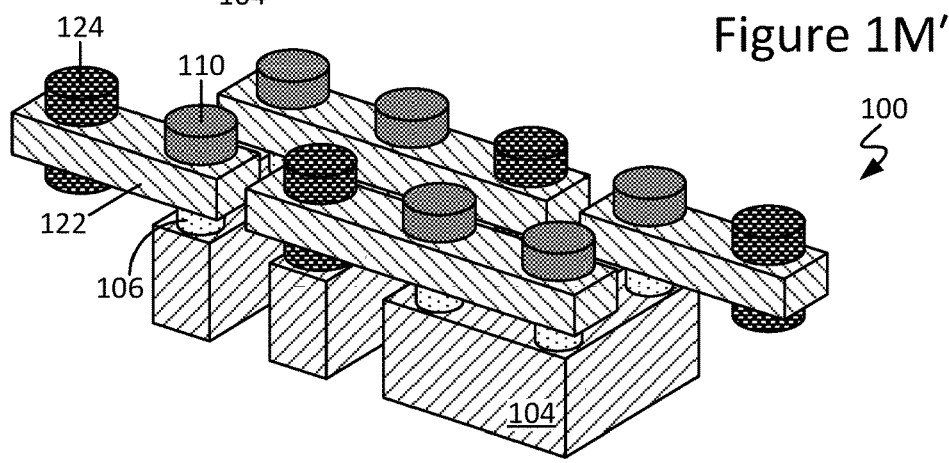
Figure 1N:
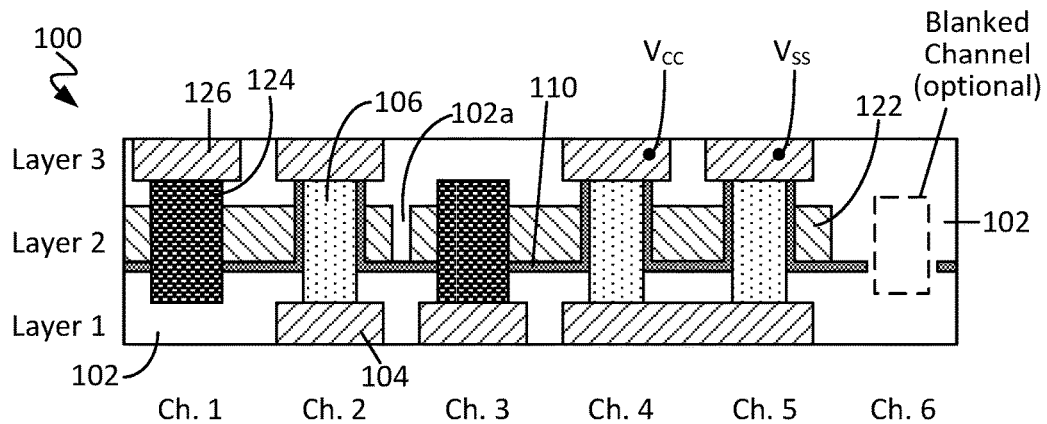
FIG. 1N is a cross-sectional view of the IC of FIG. 1M after thinning, further formation of the ILD and one or more interconnects, and planarization, in accordance with an embodiment of the present disclosure.
Figure 1N:
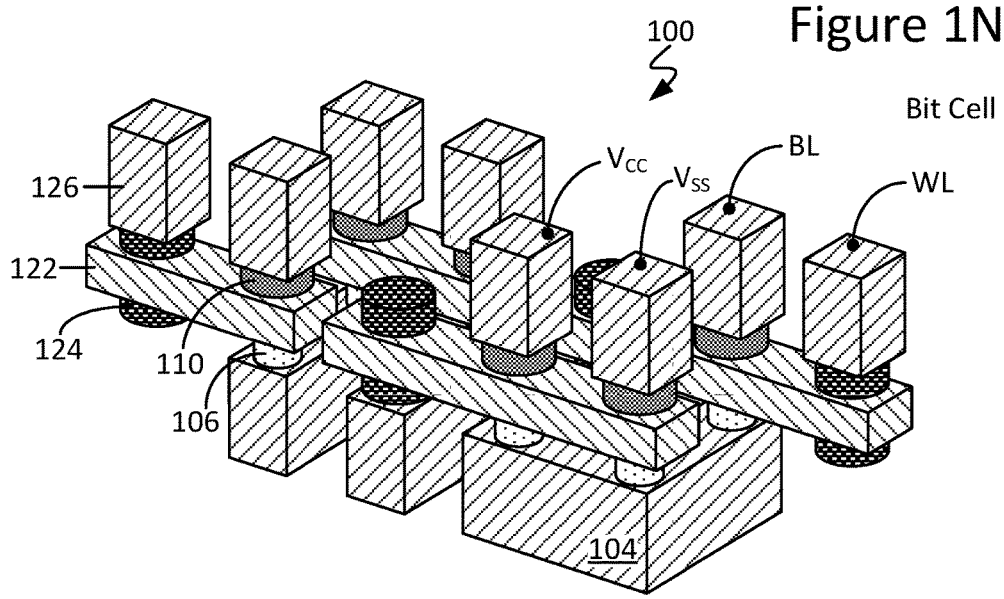

FIGS. 1A-1N illustrate an integrated circuit (IC) fabrication process flow, in accordance with an embodiment of the present disclosure. As described herein, the disclosed process flow can be used to form any of a wide range of vertical channel architectures, such as, for example, a bit cell (e.g., as in FIGS. 1N and 2), a CMOS-like device (e.g., as in FIG. 3A), a TFET-like device (e.g., as in FIG. 3B), an inverter (e.g., as in FIGS. 4 and 5), and a NAND logic gate (e.g., as in FIG. 6), each discussed in turn below. It should be noted, however, that the present disclosure is not so limited only to these example structures/devices. Numerous vertical semiconductor channel architectures that can be formed, in part or in whole, using techniques disclosed herein will be apparent in light of this disclosure. Also, as discussed herein, the disclosed process flow can be used, in accordance with some embodiments, to provide a given vertical semiconductor channel architecture with any of a wide range of electrical connections (e.g., source to gate; drain to gate; source to drain; source to gate to drain; etc.), as desired for a given target application or end-use.

The process may begin as in FIG. 1A, which is a cross-sectional view of an integrated circuit (IC) 100 configured in accordance with an embodiment of the present disclosure. FIG. 1A' illustrates a three-dimensional perspective view of the IC 100 of FIG. 1A (with dielectric layer 102 graphically omitted for ease of viewing). As can be seen, IC 100 initially may include a dielectric layer 102. In accordance with some embodiments, dielectric layer 102 can be formed, for example, on a substrate, wafer, or any other suitable surface, and in some cases may be formed as an inter-layer dielectric (ILD). Dielectric layer 102 can be formed from any suitable electrically insulating or dielectric material (or combination of such materials), using any of a wide range of suitable techniques. For instance, in accordance with some embodiments, dielectric layer 102 may be formed from: (1) an oxide, such as silicon dioxide ($SiO_2$), aluminum oxide ($Al_2O_3$), or a carbon (C)-doped oxide; (2) a nitride, such as silicon nitride ($Si_3N_4$); (3) a polymer, such as perfluorocyclobutane or polytetrafluoroethylene; (4) a phosphosilicate glass (PSG); (5) a fluorosilicate glass (FSG); (6) an organosilicate glass (OSG), such as silsesquioxane or siloxane, carbosilane material (e.g., methyl- or ethyl-bridged silicates or carbosilane-ringed structures, such as 1,3,5-trisilacyclohexane derivatives); and/or (7) a combination of any one or more thereof. It should be noted, however, that the present disclosure is not so limited, as in a more general sense, and in accordance with some embodiments, dielectric layer 102 may be formed, in part or in whole, from any dielectric material (e.g., low-K dielectric, high-K dielectric, or otherwise), as desired for a given target application or end-use. In accordance with some embodiments, dielectric layer 102 may be formed, for example, using: (1) a physical vapor deposition (PVD) process; (2) a chemical vapor deposition (CVD) process, such as plasma-enhanced CVD (PECVD); (3) a spin-on deposition (SOD) process; and/or (4) a combination of any one or more thereof. Other suitable materials and techniques for forming dielectric layer 102 will depend on a given application and will be apparent in light of this disclosure.

As can be seen further from FIG. 1A, dielectric layer 102 may have one or more electrical interconnects 104 (e.g., a lower routing layer) formed therein. The geometry of a given interconnect 104 can be customized (e.g., polygonal, curvilinear, or any other geometric shape), as desired for a given target application or end-use, and in accordance with some example embodiments, may be: (1) a single-damascene interconnect structure (e.g., a trench; a via); (2) a dual-damascene interconnect structure (e.g., a trench with an underlying via); (3) an anisotropic interconnect structure; and/or (4) an isotropic interconnect structure. Numerous suitable configurations for interconnect(s) 104 will be apparent in light of this disclosure.

A given interconnect 104 may be formed from any suitable electrically conductive material (or combination of such materials), using any of a wide range of suitable techniques. For example, in accordance with some embodiments, a given interconnect 104 may be formed from: (1) tungsten (W); (2) copper (Cu); (3) cobalt (Co); (4) molybdenum (Mo); (5) rhodium (Rh); (6) beryllium (Be); (7) chromium (Cr); (8) manganese (Mn); (9) aluminum (Al); (10) ruthenium (Ru); (11) palladium (Pd); (12) nickel (Ni); (13) cobalt tungsten phosphide (CoWP); (14) cobalt tungsten boron (CoWB); (15) copper germanium (CuGe); (16) silicon (Si); and/or (17) an alloy or other combination of any one or more thereof. In accordance with some embodiments, interconnect(s) 104 may be formed, for example, using: (1) an electroplating process; (2) an electroless deposition process; (3) a chemical vapor deposition (CVD) process; and/or (4) a combination of any one or more thereof. Other suitable materials and techniques for forming a given interconnect 104 will depend on a given application and will be apparent in light of this disclosure.

After formation of interconnect(s) 104, it may be desirable in some instances to planarize IC 100, for example, to remove any undesired excess (e.g., overburden) of: (1) a given interconnect 104; and/or (2) dielectric layer 102. To that end, IC 100 may undergo a chemical-mechanical planarization (CMP) process, an etch-and-clean process, and/or any other suitable planarization/polish process, as will be apparent in light of this disclosure. In some cases, after planarization, dielectric layer 102 and interconnect(s) 104 may have a thickness, for example, in the range of about 10-50 nm (e.g., about 10-30 nm, about 30-50 nm, or any other sub-range in the range of about 10-50 nm). However, the dimensions of dielectric layer 102 and/or a given interconnect 104 are not so limited only to this example range, as in a more general sense, and in accordance with some embodiments, the dimensions of dielectric layer 102 and interconnect(s) 104 can be customized, as desired for a given target application or end-use. Also, as will be appreciated in light of this disclosure, the dimensions of dielectric layer 102 and/or the one or more interconnects 104 may change (e.g., may increase and/or decrease) during processing, as described herein. In some cases, dielectric layer 102 and/or a given interconnect 104 may have a substantially uniform thickness over the topography provided, for example, by any underlying layers of IC 100 (e.g., a substrate, wafer, or any other suitable surface). In some other instances, however, dielectric layer 102 and/or a given interconnect 104 may be provided with a non-uniform or otherwise varying thickness over such topography. For example, in some cases a first portion of dielectric layer 102 may have a thickness within a first range, while a second portion thereof has a thickness within a second, different range. In some cases, a first portion of a given interconnect 104 may have a thickness within a first range, while a second portion thereof has a thickness within a second, different range. Other suitable dimensions for dielectric layer 102 and interconnect(s) 104 will depend on a given application and will be apparent in light of this disclosure.

The process may continue as in FIG. 1B, which is a cross-sectional view of the IC 100 of FIG. 1A after transfer of a semiconductor layer 106 thereto, in accordance with an embodiment of the present disclosure. Semiconductor layer 106 can be formed from any suitable semiconductor material (or combination of such materials), using any of a wide range of suitable techniques. For example, in accordance with some embodiments, semiconductor layer 106 may be formed from: (1) silicon (Si); (2) germanium (Ge); (3) silicon germanium (SiGe); (4) a III-V compound, such as gallium arsenide (GaAs), indium gallium arsenide (InGaAs), gallium nitride (GaN), or indium phosphide (InP); and/or (5) a combination of any one or more thereof. In accordance with some embodiments, semiconductor layer 106 may be provided over IC 100 using a blanket semiconductor transfer process, such as, for example: (1) an ion-cut process; (2) an amorphous layer blister process; (3) a strain-induced spalling process; (4) a backside grinding process; and/or (5) a combination of any one or more thereof. Other suitable materials and techniques for providing semiconductor layer 106 over IC 100 will depend on a given application and will be apparent in light of this disclosure.

Furthermore, the dimensions of semiconductor layer 106 can be customized, as desired for a given target application or end-use, and in some instances may be selected, in part or in whole, based on the desired channel length for IC 100. In accordance with some embodiments, semiconductor layer 106 may have a thickness, for example, in the range of about 10-100 nm (e.g., about 10-50 nm, about 50-100 nm, or any other sub-range in the range of about 10-100 nm). In some cases, semiconductor layer 106 may have a substantially uniform thickness over the topography provided, for example, by any underlying layers of IC 100 (e.g., dielectric layer 102; a given interconnect 104). In some instances, semiconductor layer 106 may be provided as a substantially conformal layer over such topography. In some other instances, however, semiconductor layer 106 may be provided with a non-uniform or otherwise varying thickness over such topography. For example, in some cases a first portion of semiconductor layer 106 may have a thickness within a first range, while a second portion thereof has a thickness within a second, different range. Other suitable dimensions for semiconductor layer 106 will depend on a given application and will be apparent in light of this disclosure.

The process may continue as in FIG. 1C, which is a cross-sectional view of the IC 100 of FIG. 1B after patterning semiconductor layer 106, in accordance with an embodiment of the present disclosure. FIG. 1C' illustrates a three-dimensional perspective view of the IC 100 of FIG. 1C (with dielectric layer 102 graphically omitted for ease of viewing). As can be seen, semiconductor layer 106 may be patterned into one or more semiconductor bodies 106 (e.g., nanowires and/or other three-dimensional semiconductor structures). To that end, any suitable lithographic patterning technique (or combination of such techniques) may be utilized. For example, in accordance with some embodiments, the one or more semiconductor bodies 106 may be patterned using: (1) an immersion lithography process; (2) an electron-beam (e-beam) lithography process; (3) an extreme ultraviolet (EUV) lithography process; and/or (4) a combination of any one or more thereof. It should be noted that, in accordance with some embodiments, semiconductor layer 106 may be patterned to form not only semiconductor bodies 106 which ultimately will serve as the one or more semiconductor channels of IC 100, but also semiconductor bodies 106 which ultimately will be removed and replaced at such locations with dummies and/or vias for IC 100 (as described herein). Other suitable techniques for patterning semiconductor layer 106 into one or more semiconductor bodies 106 will depend on a given application and will be apparent in light of this disclosure.

The geometry, dimensions, spacing, and arrangement of the one or more semiconductor bodies 106 (e.g., nanowires and/or other three-dimensional semiconductor structures) formed from semiconductor layer 106 can be customized, as desired for a given target application or end-use, and in some cases may be selected, in part or in whole, based on the desired semiconductor channel performance for a given host IC 100. In some instances, a given semiconductor body 106 may be generally cylindrical in shape, having a circular, elliptical, or other curvilinear cross-sectional profile, whereas in some other instances, a given semiconductor body 106 may be generally prismatic in shape, having a square, rectangular, hexagonal, or other polygonal cross-sectional profile. In some cases, a given semiconductor body 106 may have a width/diameter ($D_1$), for example, in the range of about 1-20 nm (e.g., about 1-5 nm, about 5-10 nm, about 10-15 nm, about 15-20 nm, or any other sub-range in the range of about 1-20 nm). In some cases, a given semiconductor body 106 may have a height/length ($D_2$), for example, in the range of about 10-100 nm (e.g., about 10-25 nm, about 25-50 nm, about 50-100 nm, or any other sub-range in the range of about 10-100 nm). In some instances, semiconductor layer 106 may be patterned into a regular array of semiconductor bodies 106 (e.g., nanowires and/or other three-dimensional semiconductor structures), in which all or nearly all of the bodies 106 are arranged in a systematic manner in relation to one another. In some other instances, semiconductor layer 106 may be patterned into a semi-regular array of semiconductor bodies 106 (e.g., nanowires and/or other three-dimensional semiconductor structures), in which a sub-set of the bodies 106 are arranged in a systematic manner in relation to one another, but at least one other body 106 is not so arranged. In some still other instances, semiconductor layer 106 may be patterned into an irregular array of semiconductor bodies 106 (e.g., nanowires and/or other three-dimensional semiconductor structures), in which the bodies 106 are not arranged in a systematic manner in relation to one another. In some cases, neighboring semiconductor bodies 106 may be substantially equidistantly spaced from one another (e.g., may exhibit a substantially constant spacing). In some other cases, however, the spacing of the one or more semiconductor bodies 106 may be varied, as desired. In some example cases, neighboring semiconductor bodies 106 may be separated from one another by a distance in the range of about 5-50 nm (e.g., about 5-25 nm, about 25-50 nm, or any other sub-range in the range of about 5-50 nm). Other suitable geometries, dimensions, spacing, and arrangements for the one or more semiconductor bodies 106 (e.g., nanowires and/or other three-dimensional semiconductor structures) of IC 100 will be apparent in light of this disclosure.

The process may continue as in FIG. 1D, which is a cross-sectional view of the IC 100 of FIG. 1C after further formation of dielectric layer 102, in accordance with an embodiment of the present disclosure. As can be seen, IC 100 may undergo further formation of dielectric layer 102, for example, within the interstitial space(s) between the one or more semiconductor bodies 106. To that end, dielectric layer 102 may be further formed using any suitable technique (or combination of techniques), such as those discussed above, for instance, with respect to FIG. 1A. As dielectric layer 102 is further formed, it may extend up a sidewall portion of a given semiconductor body 106 by a distance ($D_3$), for example, in the range of about 1-10 nm (e.g., about 1-5 nm, about 5-10 nm, or any other sub-range in the range of about 1-10 nm). It should be noted, however, that the present disclosure is not so limited only to this example range, as in a more general sense, and in accordance with some embodiments, the amount by which IC 100 is further filled with dielectric layer 102 may be customized, as desired for a given target application or end-use.

The process may continue as in FIG. 1E, which is a cross-sectional view of the IC 100 of FIG. 1D after formation of a dielectric layer 110, in accordance with an embodiment of the present disclosure. FIG. 1E' illustrates a three-dimensional perspective view of the IC 100 of FIG. 1E (with dielectric layer 102 graphically omitted and dielectric layer 110 partially graphically omitted for ease of viewing). Dielectric layer 110 can be formed from any suitable dielectric material (or combination of such materials), using any of a wide range of suitable techniques. For example, in accordance with some embodiments, dielectric layer 110 may be formed from: (1) hafnium oxide ($HfO_2$); (2) zirconium dioxide ($ZrO_2$); (3) tantalum pentoxide ($Ta_2O_5$); (4) silicon dioxide ($SiO_2$); (5) aluminum oxide ($Al_2O_3$); (6) titanium dioxide ($TiO_2$); (7) lanthanum oxide ($La_2O_3$); (8) hafnium silicate ($HfSiO_4$); (9) zirconium silicate ($ZrSiO_4$); (10) strontium titanate ($SrTiO_3$); and/or (11) a combination of any one or more thereof. It should be noted, however, that the present disclosure is not so limited, as in a more general sense, and in accordance with some embodiments, dielectric layer 110 may be formed, in part or in whole, from any dielectric material (e.g., low-K dielectric, high-K dielectric, or otherwise), as desired for a given target application or end-use. In accordance with some embodiments, dielectric layer 110 may be formed, for example, using: (1) a chemical vapor deposition (CVD) process, such as plasma-enhanced CVD (PECVD); (2) an atomic layer deposition (ALD) process; and/or (3) a combination of any one or more thereof. Other suitable materials and techniques for forming dielectric layer 110 will depend on a given application and will be apparent in light of this disclosure.

Furthermore, the dimensions of dielectric layer 110 can be customized, as desired for a given target application or end-use. In accordance with some embodiments, dielectric layer 110 may have a thickness, for example, in the range of about 1-10 nm (e.g., about 1-2.5 nm, about 2.5-5 nm, about 5-7.5 nm, about 7.5-10 nm, or any other sub-range in the range of about 1-10 nm). In some instances, dielectric layer 110 may have a substantially uniform thickness over the topography provided, for example, by any underlying layers of IC 100 (e.g., the one or more semiconductor bodies 106; dielectric layer 102). In some instances, dielectric layer 110 may be provided as a substantially conformal layer over such topography. In some other instances, however, dielectric layer 110 may be provided with a non-uniform or otherwise varying thickness over such topography. For example, in some cases a first portion of dielectric layer 110 may have a thickness within a first range, while a second portion thereof has a thickness within a second, different range. Other suitable dimensions for dielectric layer 110 will depend on a given application and will be apparent in light of this disclosure.

The process may continue as in FIG. 1F, which is a cross-sectional view of the IC 100 of FIG. 1E after further formation of dielectric layer 102 and planarization, in accordance with an embodiment of the present disclosure. As can be seen, IC 100 may undergo further formation of dielectric layer 102, for example, within the interstitial space(s) between the one or more semiconductor bodies 106 and attendant portion(s) of dielectric layer 110. To that end, dielectric layer 102 may be further formed using any suitable technique (or combination of techniques), such as those discussed above, for instance, with respect to FIG. 1A. As dielectric layer 102 is further formed, it may extend over an upper surface of dielectric layer 110 (or otherwise over an upper portion of a given semiconductor body 106). After this further formation of dielectric layer 102, it may be desirable in some instances to planarize IC 100, for example, to remove any undesired excess (e.g., overburden) thereof. To that end, IC 100 may undergo any suitable planarization/polish process, such as those discussed above, for instance, with respect to FIG. 1A. In some cases, through planarization, the thickness of dielectric layer 102 may be reduced so as to make an upper surface of dielectric layer 102 substantially flush (e.g., precisely flush or otherwise within a given tolerance) with an upper surface of dielectric layer 110 (or an upper surface of a given semiconductor body 106), such as can be seen generally from FIG. 1F. However, the present disclosure is not so limited, as in a more general sense, and in accordance with some embodiments, dielectric layer 102 may be reduced to any given thickness, as desired for a given target application or end-use. Numerous suitable configurations will be apparent in light of this disclosure.

The process may continue as in FIG. 1G, which is a cross-sectional view of the IC 100 of FIG. 1F after formation and patterning of a hardmask layer 114 and patterning of IC 100 therewith, in accordance with an embodiment of the present disclosure. Hardmask layer 114 can be formed from any suitable hardmask material (or combination of such materials), using any of a wide range of suitable techniques. For example, in accordance with some embodiments, hardmask layer 114 may be formed from: (1) a highly carbon (C)-containing hardmask (e.g., having a carbon content greater than or equal to about 40% by weight); (2) silicon dioxide ($SiO_2$); (3) silicon nitride ($Si_3N_4$); (4) silicon oxynitride ($SiO_xN_y$); and/or (5) a combination of any one or more thereof. In accordance with some embodiments, hardmask layer 114 may be formed using: (1) a physical vapor deposition (PVD) process, such as sputter deposition; (2) a chemical vapor deposition (CVD) process, such as plasma-enhanced CVD (PECVD); (3) a spin-on deposition (SOD) process; (4) an atomic layer deposition (ALD) process; and/or (5) a combination of any one or more thereof. Other suitable materials and techniques for forming hardmask layer 114 will depend on a given application and will be apparent in light of this disclosure.

Furthermore, the dimensions of hardmask layer 114 can be customized, as desired for a given target application or end-use. In accordance with some embodiments, hardmask layer 114 may have a thickness, for example, in the range of about 1-30 nm (e.g., about 1-10 nm, about 10-20 nm, about 20-30 nm, or any other sub-range in the range of about 1-30 nm). In some instances, hardmask layer 114 may have a substantially uniform thickness over the topography provided, for example, by any underlying layers of IC 100 (e.g., dielectric layer 110; a given semiconductor body 106; dielectric layer 102). In some instances, hardmask layer 114 may be provided as a substantially conformal layer over such topography. In some other instances, however, hardmask layer 114 may be provided with a non-uniform or otherwise varying thickness over such topography. For example, in some cases a first portion of hardmask layer 114 may have a thickness within a first range, while a second portion thereof has a thickness within a second, different range. Other suitable dimensions for hardmask layer 114 will be apparent in light of this disclosure.

After formation thereof, hardmask layer 114 may undergo patterning using any suitable lithographic patterning technique (or combination of such techniques), such as those discussed above, for instance, with respect to forming semiconductor bodies 106. In accordance with some embodiments, hardmask layer 114 may be patterned, for example, to reveal one or more channels of IC 100 that are to be optionally blanked (e.g., selectively etched out or otherwise removed from IC 100 and replaced at such location with additional material for dielectric layer 102, as discussed below). Thereafter, the process may continue with utilizing the patterned hardmask layer 114 as a mask and etching out one or more semiconductor bodies 106 (and associated portions of dielectric layer 110, if present) and into dielectric layer 102, forming one or more openings 116 in IC 100, as generally can be seen from FIG. 1G. To that end, IC 100 may be patterned, in accordance with some embodiments, using a dry etching process and/or a wet etching process. In some instances, an anisotropic plasma etching process may be employed. Also, in accordance with some embodiments, the etch chemistry for etching IC 100 can be customized, as desired, and in some instances may be selective to etching the material(s) of semiconductor bodies 106 and/or dielectric layer 110 as compared to the material(s) of hardmask layer 114 and/or dielectric layer 102. Furthermore, the geometry and dimensions of a given opening 116 (and thus of a given optional blanked region of IC 100) can be customized, as desired for a given target application or end-use, and in some instances may depend, at least in part, on the type of etch process and/or etch chemistry utilized. Other suitable techniques for patterning IC 100 with one or more openings 116 will depend on a given application and will be apparent in light of this disclosure.

The process may continue as in FIG. 1H, which is a cross-sectional view of the IC 100 of FIG. 1G after removal of hardmask layer 114, further formation of dielectric layer 102, and planarization, in accordance with an embodiment of the present disclosure. FIG. 1H' illustrates a three-dimensional perspective view of the IC 100 of FIG. 1H (with dielectric layer 102 graphically omitted and dielectric layer 110 partially graphically omitted for ease of viewing). Hardmask layer 114 can be removed from IC 100 using any suitable planarization/polish process, cleans, etc., as typically done. In some instances in which hardmask layer 114 is a highly carbon (C)-containing hardmask (e.g., having a carbon content greater than or equal to about 40% by weight), an oxygen ($O_2$)-based plasma ashing and clean process may be utilized, in accordance with some embodiments. Other suitable techniques for removing hardmask layer 114 will depend on a given application and will be apparent in light of this disclosure.

After removing hardmask layer 114, IC 100 may undergo further formation of dielectric layer 102, for example, to fill a given opening 116 to optionally blank a given channel of IC 100, in accordance with some embodiments. To that end, dielectric layer 102 may be further formed using any suitable technique (or combination of techniques), such as those discussed above, for instance, with respect to FIG. 1A. As dielectric layer 102 is further formed, it may extend over an upper surface of dielectric layer 110 (or otherwise over an upper portion of a given semiconductor body 106). After this further formation of dielectric layer 102, it may be desirable in some instances to planarize IC 100, for example, to remove any undesired excess (e.g., overburden) thereof. To that end, IC 100 may undergo any suitable planarization/polish process, such as those discussed above, for instance, with respect to FIG. 1A. In some cases, through planarization, the thickness of dielectric layer 102 may be reduced so as to make an upper surface of dielectric layer 102 substantially flush (e.g., precisely flush or otherwise within a given tolerance) with an upper surface of dielectric layer 110 (or an upper surface of a given semiconductor body 106), such as can be seen generally from FIG. 1H. However, the present disclosure is not so limited, as in a more general sense, and in accordance with some embodiments, dielectric layer 102 may be reduced to any given thickness, as desired for a given target application or end-use. Numerous suitable configurations will be apparent in light of this disclosure.

The process may continue as in FIG. 1I, which is a cross-sectional view of the IC 100 of FIG. 1H after formation and patterning of a hardmask layer 118 and patterning of IC 100 therewith, in accordance with an embodiment of the present disclosure. Hardmask layer 118 can be formed from any suitable hardmask material (or combination of materials), using any of a wide range of suitable techniques, and in some cases may be formed using any of the example materials and example techniques discussed above, for instance, with respect to hardmask layer 114. Furthermore, the dimensions of hardmask layer 118 can be customized, as desired for a given target application or end-use, and in some cases may be substantially similar to those discussed above, for instance, with respect to hardmask layer 114. In some instances, hardmask layer 118 may have a substantially uniform thickness over the topography provided, for example, by any underlying layers of IC 100 (e.g., dielectric layer 102; dielectric layer 110; a given semiconductor body 106). In some instances, hardmask layer 118 may be provided as a substantially conformal layer over such topography. In some other instances, however, hardmask layer 118 may be provided with a non-uniform or otherwise varying thickness over such topography. For example, in some cases a first portion of hardmask layer 118 may have a thickness within a first range, while a second portion thereof has a thickness within a second, different range. Other suitable material, dimensions, and techniques for forming hardmask layer 118 will depend on a given application and will be apparent in light of this disclosure.

After formation thereof, hardmask layer 118 may undergo patterning using any suitable lithographic patterning technique (or combination of such techniques), such as those discussed above, for instance, with respect to forming semiconductor bodies 106. In accordance with some embodiments, hardmask layer 118 may be patterned, for example, to protect one or more portions of underlying dielectric layer 102 (e.g., the one or more optionally blanked channels of IC 100, as discussed above; one or more separator portions 102a, as generally shown in FIG. 1I). Thereafter, the process may continue with utilizing the patterned hardmask layer 118 as a mask and etching out a portion of dielectric layer 102 to provide a gate trench 120 in IC 100, as generally can be seen from FIG. 1I. To that end, IC 100 may be patterned, in accordance with some embodiments, using a dry etching process and/or a wet etching process. In some instances, an anisotropic plasma etching process may be employed. Also, in accordance with some embodiments, the etch chemistry for etching IC 100 can be customized, as desired, and in some instances may be selective to etching the material(s) of dielectric layer 102 as compared to the material(s) of hardmask layer 118, dielectric layer 110, and/or semiconductor bodies 106. Furthermore, the geometry and dimensions of a gate trench 120 can be customized, as desired for a given target application or end-use, and in some instances may depend, at least in part, on the type of etch process and/or etch chemistry utilized. In some cases, dielectric layer 102 may be etched out until underlying dielectric layer 110 is reached. Other suitable techniques for patterning IC 100 with gate trench 120 will depend on a given application and will be apparent in light of this disclosure.

After patterning gate trench 120, the process may continue with removing hardmask layer 118 from IC 100. To that end, any suitable planarization/polish process, cleans, etc., as typically done, may be utilized. In some cases, a plasma ashing and clean process (e.g., such as that discussed above with respect to hardmask layer 114) may be utilized. Other suitable techniques for removing hardmask layer 118 will depend on a given application and will be apparent in light of this disclosure.

The process may continue as in FIG. 1J, which is a cross-sectional view of the IC 100 of FIG. 1I after formation of a gate layer 122, in accordance with an embodiment of the present disclosure. In accordance with some embodiments, gate layer 122 may be configured to serve not only as a gate for one or more vertical transistors of IC 100, but also as a local interconnect within IC 100. Gate layer 122 can be formed from any suitable gate material (or combination of such materials), using any of a wide range of suitable techniques. For example, in accordance with some embodiments, gate layer 122 may be formed from: (1) tungsten (W); (2) aluminum (Al); (3) titanium (Ti); (4) titanium nitride (TiN); (5) polysilicon (doped or undoped); and/or (6) an alloy or other combination of any one or more thereof. In accordance with some embodiments, IC 100 may be globally filled with a gate layer 122 of any desired initial thickness, and in some cases, gate layer 122 may be formed with sufficient initial thickness, for example, so as to extend out of gate trench 120 and over an upper surface of dielectric layer 110 and/or dielectric layer 102 (e.g., as can be seen generally from FIG. 1J). To that end, gate layer 122 may be formed, in accordance with some embodiments, using: (1) a physical vapor deposition (PVD) process; (2) a chemical vapor deposition (CVD) process; (3) an electroplating process; (4) an electroless deposition process; and/or (5) a combination of any one or more thereof. Other suitable materials and techniques for forming gate layer 122 will depend on a given application and will be apparent in light of this disclosure.

The process may continue as in FIG. 1K, which is a cross-sectional view of the IC 100 of FIG. 1J after recessing gate layer 122, in accordance with an embodiment of the present disclosure. FIG. 1K' illustrates a three-dimensional perspective view of the IC 100 of FIG. 1K (with dielectric layer 102 graphically omitted and dielectric layer 110 partially graphically omitted for ease of viewing). In accordance with some embodiments, gate layer 122 may be recessed to remove excess thereof from IC 100 to achieve a given desired gate thickness. To that end, gate layer 122 may undergo: (1) any suitable planarization/polish process, such as those discussed above, for instance, with respect to FIG. 1A; and/or (2) any suitable dry etching process and/or wet etching process. The dimensions of gate layer 122 may be customized, as desired for a given target application or end-use, and in some cases may be selected, at least in part, based on the desired active semiconductor channel length of a given host IC 100. In accordance with some embodiments, gate layer 122 may have a thickness (after recessing), for example, in the range of about 10-30 nm (e.g., about 10-20 nm, about 20-30 nm, or any other sub-range in the range of about 10-30 nm). In some instances, gate layer 122 may have a substantially uniform thickness over the topography provided, for example, by any underlying layers of IC 100 (e.g., portions of dielectric layer 110 within gate trench 120). In some other instances, however, gate layer 122 may be provided with a non-uniform or otherwise varying thickness over such topography. For example, in some cases a first portion of gate layer 122 may have a thickness within a first range, while a second portion thereof has a thickness within a second, different range. Other suitable dimensions for gate layer 122 will depend on a given application and will be apparent in light of this disclosure.

As can be seen, the resultant gate layer 122 may be configured, in accordance with some embodiments, to surround the active channel portion of each vertical semiconductor body 106 (or some sub-set thereof), as desired. In some cases, the presence of a given separator portion 102a of dielectric layer 102 may facilitate designation of sub-sets of bodies 106 for IC 100. In some cases, gate layer 122 may be a continuous layer, whereas in some other cases, gate layer 122 may have one or more regions of discontinuity (e.g., gaps), such as where a separator portion 102a resides and/or where a blanked channel is optionally formed (e.g., as generally shown in FIG. 1K). As can be seen further, after recessing gate layer 122 to achieve a given desired gate thickness, IC 100 may undergo further formation of dielectric layer 102, for example, within the interstitial space(s) over gate layer 122 between the one or more semiconductor bodies 106 and attendant dielectric layer 110. To that end, dielectric layer 102 may be further formed using any suitable technique (or combination of techniques), such as those discussed above, for instance, with respect to FIG. 1A. As dielectric layer 102 is further formed, it may come to join with a given separator portion 102a of IC 100, if present. Also, as dielectric layer 102 is further formed, it may extend over an upper surface of dielectric layer 110 over a given semiconductor body 106. After this further formation of dielectric layer 102, it may be desirable in some instances to planarize IC 100, for example, to remove any undesired excess (e.g., overburden) thereof. To that end, IC 100 may undergo any suitable planarization/polish process, such as those discussed above, for instance, with respect to FIG. 1A. In some cases, through planarization, the thickness of dielectric layer 102 may be reduced so as to make an upper surface of dielectric layer 102 substantially flush (e.g., precisely flush or otherwise within a given tolerance) with an upper surface of dielectric layer 110 over a given semiconductor body 106, such as can be seen generally from FIG. 1K.

However, the present disclosure is not so limited, as in a more general sense, and in accordance with some embodiments, dielectric layer 102 may be reduced to any given thickness, as desired for a given target application or end-use. Numerous suitable configurations will be apparent in light of this disclosure.

The process may continue as in FIG. 1L, which is a cross-sectional view of the IC 100 of FIG. 1K after patterning, in accordance with an embodiment of the present disclosure. As can be seen, one or more channels of IC 100 may be selectively etched out (or otherwise removed) and replaced, for example, with one or more electrically conductive plugs 124, as discussed below with respect to FIG. 1M. In particular, one or more semiconductor bodies 106 (and associated portions of dielectric layer 110) may be etched out, forming one or more openings 128 in IC 100, as generally can be seen from FIG. 1L. To that end, IC 100 may be patterned, in accordance with some embodiments, using a dry etching process and/or a wet etching process. In some instances, an anisotropic plasma etching process may be employed. Also, in accordance with some embodiments, the etch chemistry for etching IC 100 can be customized, as desired, and in some instances may be selective to etching the material(s) of semiconductor bodies 106 and/or dielectric layer 110 as compared to the material(s) of gate layer 122 and/or dielectric layer 102. Furthermore, the geometry and dimensions of a given opening 128 (and thus of a given electrically conductive plug 124 of IC 100) can be customized, as desired for a given target application or end-use, and in some instances may depend, at least in part, on the type of etch process and/or etch chemistry utilized. Other suitable techniques for patterning IC 100 with one or more openings 128 will depend on a given application and will be apparent in light of this disclosure.

The process may continue as in FIG. 1M, which is a cross-sectional view of the IC 100 of FIG. 1L after formation of one or more electrically conductive plugs 124, in accordance with an embodiment of the present disclosure. FIG. 1M' illustrates a three-dimensional perspective view of the IC 100 of FIG. 1M (with dielectric layer 102 graphically omitted and dielectric layer 110 partially graphically omitted for ease of viewing). By filling a given opening 128 with an electrically conductive plug 124, a given channel of IC 100 may be converted to a via-type interconnect, in accordance with some embodiments. In some cases, a given electrically conductive plug 124 may be configured to serve, at least in part, as an inter-layer routing element for a host IC 100. In accordance with some embodiments, a given electrically conductive plug 124 may be configured to provide an electrical connection, for example, between: (1) a given upper interconnect 126 and an underlying gate layer 122; (2) a given lower interconnect 104 and an overlying gate layer 122; (3) a given upper interconnect 126 and a given underlying lower interconnect 104; and/or (4) a given upper interconnect 126, an underlying gate layer 122, and a given underlying interconnect 104. Numerous configurations and combinations of electrical connections will be apparent in light of this disclosure.

The one or more electrically conductive plugs 124 of IC 100 can be formed from any suitable electrically conductive material (or combination of such materials), using any of a wide range of techniques. For example, in accordance with some embodiments, a given electrically conductive plug 124 may be formed from: (1) tungsten (W); (2) titanium (Ti); (3) aluminum (Al); (4) copper (Cu); and/or (5) an alloy (e.g., Ti—W) or other combination of any one or more thereof. In accordance with some embodiments, the one or more electrically conductive plugs 124 may be formed, for example, using: (1) a physical vapor deposition (PVD) process; (2) a chemical vapor deposition (CVD) process; (3) an electroplating process; (4) an electroless deposition process; and/or (5) a combination of any one or more thereof. Other suitable materials and techniques for forming electrically conductive plug(s) 124 will depend on a given application and will be apparent in light of this disclosure.

Furthermore, the dimensions of a given electrically conductive plug 124 can be customized, as desired for a given target application or end-use, and in some cases may depend, at least in part, on the dimensions of a given host opening 128. In accordance with some embodiments, a given electrically conductive plug 124 may have a width/diameter, for example, about equal to the width/diameter of a given semiconductor body 106 and associated portion(s) of dielectric layer 110 removed from IC 100 in forming a given opening 128. In accordance with some embodiments, a given electrically conductive plug 124 may have a length/height, for example, about equal to the length/height of a given semiconductor body 106 and associated portion(s) of dielectric layer 110 removed from IC 100 in forming a given opening 128. Other suitable dimensions for the electrically conductive plug(s) 124 of IC 10 will depend on a given application and will be apparent in light of this disclosure.

The process may continue as in FIG. 1N, which is a cross-sectional view of the IC 100 of FIG. 1M after thinning, further formation of dielectric layer 102 and one or more interconnects 126 (e.g., an upper routing layer), and planarization, in accordance with an embodiment of the present disclosure. FIG. 1N' illustrates a three-dimensional perspective view of the IC 100 of FIG. 1N (with dielectric layer 102 graphically omitted and dielectric layer 110 partially graphically omitted for ease of viewing). After formation of electrically conductive plug(s) 124, IC 100 may undergo thinning, in accordance with some embodiments, to remove any undesired portion of: (1) dielectric layer 102; (2) dielectric layer 110; and/or (3) electrically conductive plug(s) 124. To that end, IC 100 may undergo any suitable planarization/polish process, such as those discussed above, for instance, with respect to FIG. 1A. As can be seen from FIG. 1N, through planarization, one or more portions of dielectric layer 110 may be removed, exposing a given underlying semiconductor body 106 (e.g., at an upper end thereof). In some cases, through planarization, the thickness of dielectric layer 102 may be reduced so as to make an upper surface of dielectric layer 102 substantially flush (e.g., precisely flush or otherwise within a given tolerance) with an upper surface of a given semiconductor body 106 and/or a given electrically conductive plug 124, such as can be seen generally from FIG. 1N. However, the present disclosure is not so limited, as in a more general sense, and in accordance with some embodiments, dielectric layer 102 and/or dielectric layer 110 may be reduced to any given thickness, as desired for a given target application or end-use. Numerous suitable configurations will be apparent in light of this disclosure.

After thinning, one or more electrical interconnects 126 may be formed over IC 100, in accordance with some embodiments. To that end, IC 100 may undergo further formation of dielectric layer 102, for example, using any suitable technique (or combination of techniques), such as those discussed above, for instance, with respect to FIG. 1A. In turn, dielectric layer 102 may be patterned using any suitable lithographic patterning technique (or combination of such techniques), such as those discussed above, for instance, with respect to patterning semiconductor layer 106, and one or more electrical interconnects 126 (e.g., an upper routing layer) may be formed within the resultant patterned dielectric layer 102. In accordance with some embodiments, a given interconnect 126 may be electronically coupled, for example, with an underlying electrically conductive plug 124 or with a given semiconductor body 106 (and associated dielectric layer 110). The geometry of a given interconnect 126 can be customized, as desired for a given target application or end-use, and in some cases may be selected from any of the example geometries discussed above, for instance, with respect to interconnect(s) 104. Also, a given interconnect 126 of IC 100 can be formed from any suitable electrically conductive material (or combination of such materials), using any of a wide range of suitable techniques, and in some cases may be formed from using one or more of the example materials and techniques discussed above, for instance, with respect to interconnect(s) 104. Other suitable materials, configurations, and techniques for forming interconnect(s) 126 will depend on a given application and will be apparent in light of this disclosure.

After formation of interconnect(s) 126, it may be desirable in some instances to planarize IC 100, for example, to remove any undesired excess (e.g., overburden) of: (1) a given interconnect 126; and/or (2) dielectric layer 102. To that end, IC 100 may undergo any suitable planarization/polish process, such as those discussed above, for instance, with respect to FIG. 1A. In some cases, after planarization, a given interconnect 126 may have a thickness, for example, in the range of about 10-50 nm (e.g., about 10-30 nm, about 30-50 nm, or any other sub-range in the range of about 10-50 nm). However, the dimensions of interconnect(s) 126 are not so limited only to this example range, as in a more general sense, and in accordance with some embodiments, the dimensions of interconnect(s) 126 can be customized, as desired for a given target application or end-use. In some cases, interconnect(s) 126 may have a substantially uniform thickness over the topography provided, for example, by any underlying layers of IC 100 (e.g., a given electrically conductive plug 124; a given semiconductor body 106 and associated dielectric layer 110; dielectric layer 102). In some other instances, however, a given interconnect 126 may be provided with a non-uniform or otherwise varying thickness over such topography. For example, in some cases a first portion of a given interconnect 126 may have a thickness within a first range, while a second portion thereof has a thickness within a second, different range. Other suitable dimensions for interconnect(s) 126 will depend on a given application and will be apparent in light of this disclosure.

As can be seen with respect to the example IC 100 of FIG. 1N, Layers 1 and 3 are configured as the source/drain, Layer 2 is configured as the gate, and each of Layers 1, 2, and 3 is configured to serve, at least in part, as a local interconnect for IC 100. Also, within the example context of the IC 100 of FIG. 1N, Channel 1 is a via-type interconnect (e.g., an electrically conductive plug 124) that electrically connects drain/source Layer 3 and gate Layer 2, and Channel 3 is a via-type interconnect (e.g., an electrically conductive plug 124) that electrically connects source/drain Layer 1 and gate Layer 2. Furthermore, within the example IC 100 of FIG. 1N, Channels 2, 4, and 5 are active vertical transistors, whereas Channel 6 is etched out and the gate is cut so as to optionally blank that channel region of IC 100.

Figure 2:
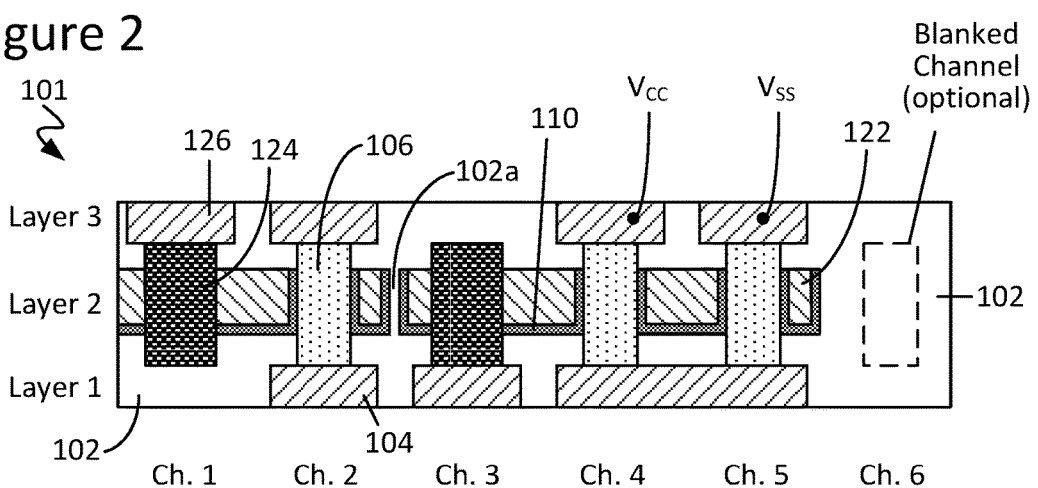
FIG. 2 is a cross-sectional view of an IC configured in accordance with another embodiment of the present disclosure

Numerous variations on the process flow of FIGS. 1A-1N, discussed above, will be apparent in light of this disclosure. For example, in accordance with some other embodiments, rather than forming dielectric layer 110 over IC 100 as described above with respect to FIG. 1E (e.g., after patterning semiconductor layer 106 into one or more semiconductor bodies 106 as in FIGS. 1B and 1C and after further formation of dielectric layer 102 as in FIG. 1E), dielectric layer 110 alternatively may be formed after etching dielectric 102 to form gate trench 120 (e.g., as described with respect to FIG. 1I) and prior to formation of gate layer 122 (e.g., as described with respect to FIG. 1J). Consequently, as can be seen by comparing the IC 100 of FIG. 1N with FIG. 2, which is a cross-sectional view of an IC 101 configured in accordance with another embodiment of the present disclosure, the IC 101 resulting from formation of dielectric layer 110 later in the process flow (e.g., between FIGS. 1I and 1J) may differ, to a greater or lesser degree, in its configuration as compared with formation of dielectric layer 110 earlier in the process flow (e.g., at FIG. 1E between FIGS. 1D and 1F). In some cases, dielectric layer 110 may have one or more regions of discontinuity (e.g., gaps), such as where a separator portion 102a resides and/or where a blanked channel is optionally formed (e.g., as generally shown in FIG. 2). In some cases, dielectric layer 110 may be configured to extend only partially up the exterior sidewall of a given semiconductor body 106 so as not to make contact with an overlying interconnect 126 (e.g., as generally shown in FIG. 2).

It should be noted, however, that the present disclosure is not so limited only to the example devices and electrical connections shown with respect to the IC 100 of FIG. 1N and the IC 101 of FIG. 2, as in a more general sense, the techniques disclosed herein can be utilized, in part or in whole, to form vertical semiconductor channel devices having any given quantity and configuration of vertical semiconductor device layers and electrical connections, as desired for a given target application or end-use. For instance, consider FIG. 3A, which is a cross-sectional view of an example IC configured in accordance with another embodiment of the present disclosure. As can be seen here, the depicted example IC includes a single vertical semiconductor layer having interchangeable source and drain layers (e.g., interconnects 104 and 126) and a single gate (e.g., gate layer 122). Thus, the example IC of FIG. 3A may be considered, in a general sense, a CMOS-like device. In contrast, consider FIG. 3B, which is a cross-sectional view of an example IC configured in accordance with another embodiment of the present disclosure. As can be seen here, the depicted example IC includes two vertical semiconductor layers having fixed source and drain layers (e.g., interconnects 104, 126a, and 126b), sharing a common drain layer (e.g., interconnect 126a), and having multiple gates (e.g., gate layers 122a and 122b). More particularly, in the IC of FIG. 3B, the lower vertical semiconductor device layer is configured as a p-type device (e.g., interconnect 104, gate 122a, and interconnect 126a), and the upper vertical semiconductor device layer is configured as an n-type device (e.g., interconnect 126a, gate 122b, and interconnect 126b). Thus, the example IC of FIG. 3B may be considered, in a general sense, a TFET-like device.

Figure 4:
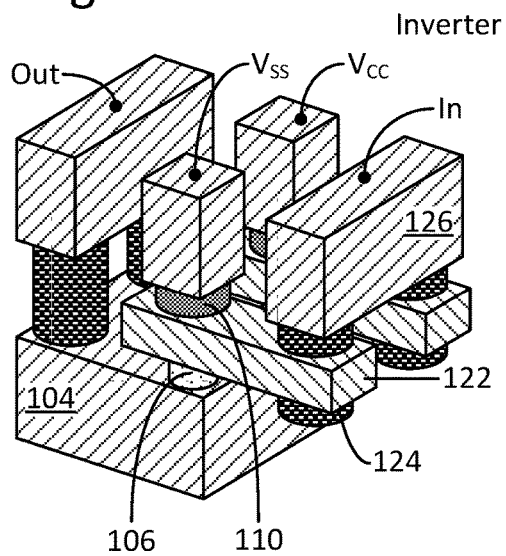
FIG. 4 illustrates a three-dimensional perspective view of an example inverter including a single vertical semiconductor layer configured in accordance with an embodiment of the present disclosure.
Figure 5:
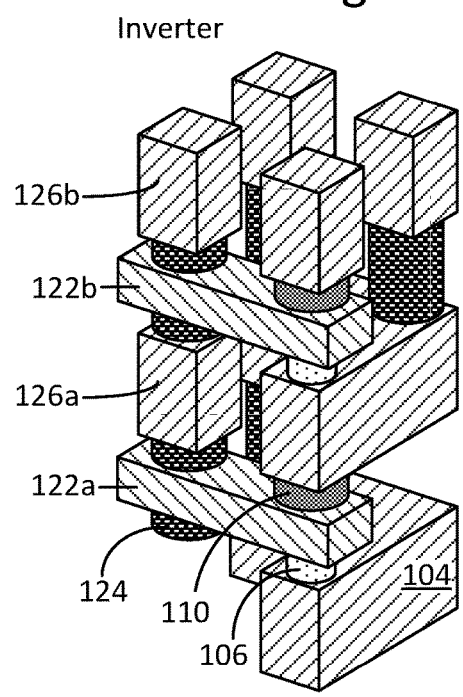
FIG. 5 illustrates a three-dimensional perspective view of an example inverter including two vertical semiconductor layers configured in accordance with another embodiment of the present disclosure.
Figure 6:
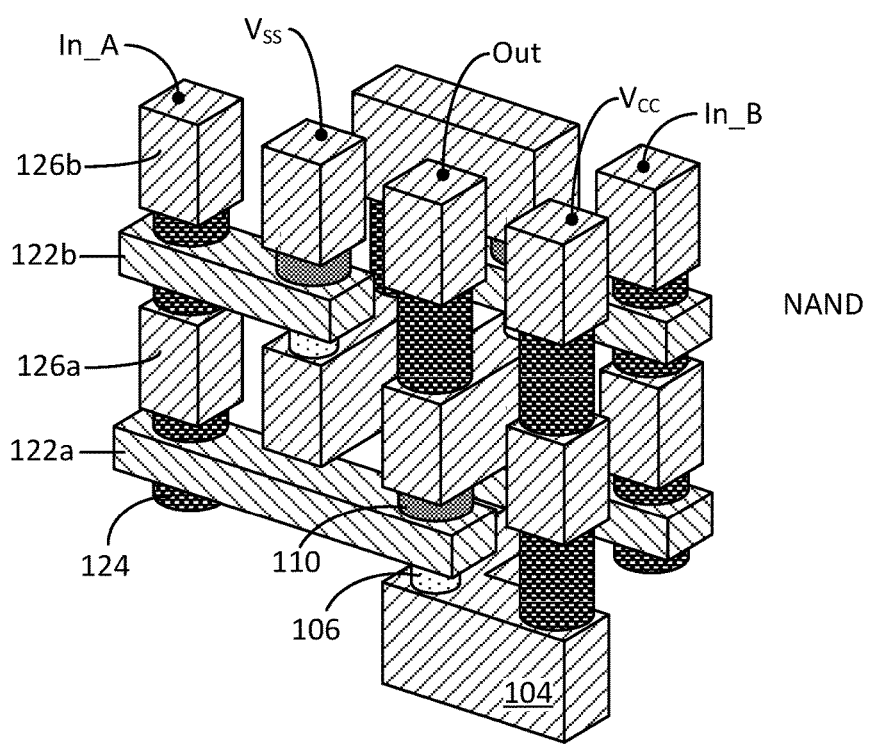
FIG. 6 illustrates a three-dimensional perspective view of an example NAND logic gate including two vertical semiconductor layers configured in accordance with an embodiment of the present disclosure.

FIG. 4 illustrates a three-dimensional perspective view of an example inverter including a single vertical semiconductor layer (e.g., of nanowires and/or other three-dimensional semiconductor structures) configured in accordance with an embodiment of the present disclosure. FIG. 5 illustrates a three-dimensional perspective view of an example inverter including two vertical semiconductor layers (e.g., of nanowires and/or other three-dimensional semiconductor structures) configured in accordance with another embodiment of the present disclosure. FIG. 6 illustrates a three-dimensional perspective view of an example NAND logic gate including two vertical semiconductor layers (e.g., of nanowires and/or other three-dimensional semiconductor structures) configured in accordance with an embodiment of the present disclosure. As will be appreciated in light of this disclosure, the disclosed techniques can be used, in accordance with some embodiments, to form an IC having any quantity of gates (e.g., gate layers 122a, 122b, etc.), routing layers (e.g., interconnects 104, 126a, 126b, etc.), semiconductor channels (e.g., semiconductor bodies 106), vias (e.g., electrically conductive plugs 124), and surrounding dielectric media (e.g., dielectric layer 102). Numerous vertical semiconductor channel architectures that may be fabricated, in part or in whole, using the disclosed techniques will be apparent in light of this disclosure.

Example System

Figure 7:
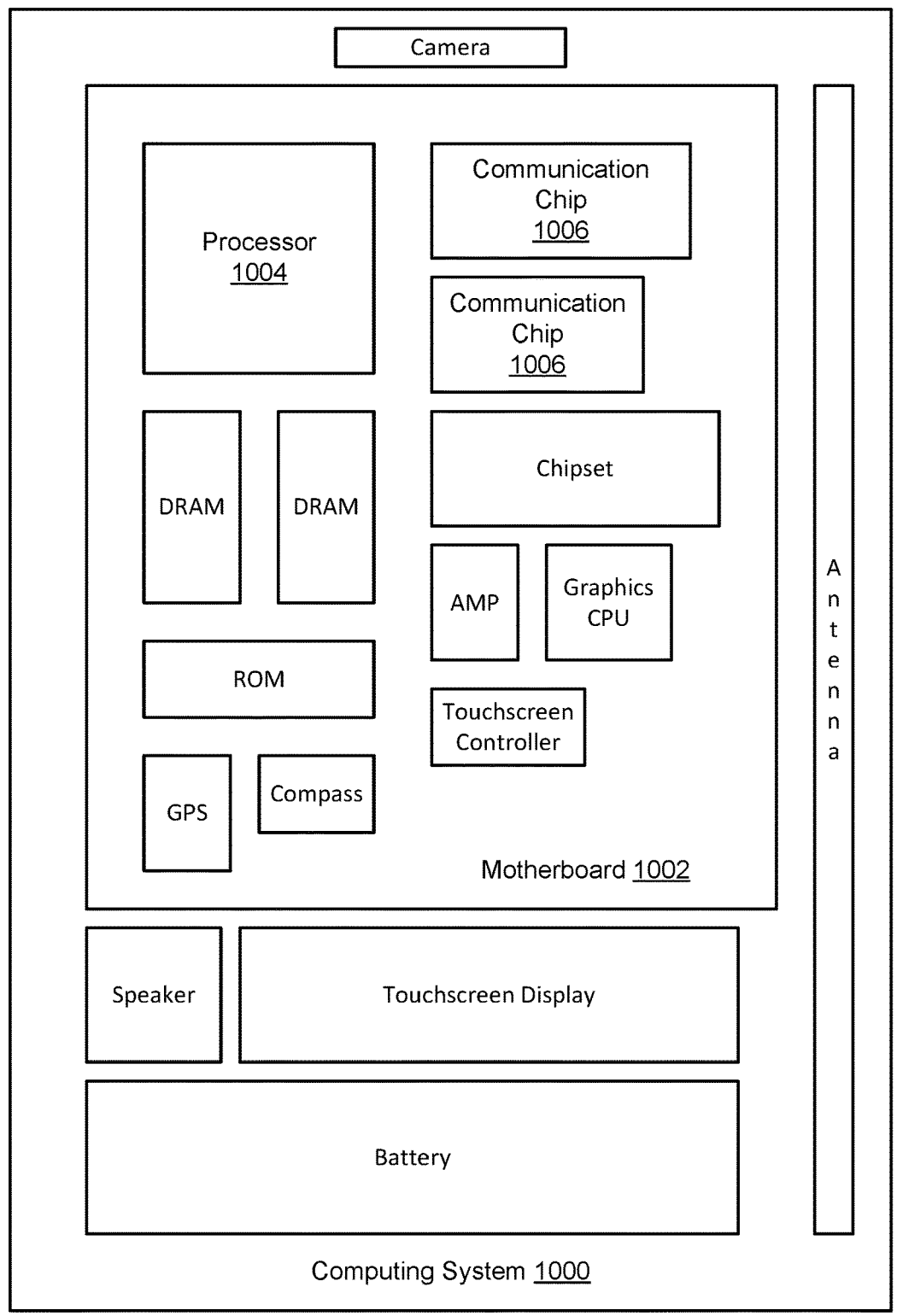
FIG. 7 illustrates a computing system implemented with integrated circuit structures or devices formed using the disclosed techniques in accordance with an example embodiment.

FIG. 7 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a first interconnect; at least one vertically oriented semiconductor body disposed over the first interconnect, wherein a first end of the at least one vertically oriented semiconductor body is in electronic contact with the first interconnect; a gate layer surrounding an active channel portion of the at least one vertically oriented semiconductor body and configured as a second interconnect; and a third interconnect disposed over the gate layer, wherein a second end of the at least one vertically oriented semiconductor body is in electronic contact with the third interconnect.

Example 2 includes the subject matter of any of Examples 1 and 3-25, wherein the at least one vertically oriented semiconductor body is a plurality of vertically oriented semiconductor bodies arranged in an array, and at least one of those vertically oriented semiconductor bodies has been replaced with a conductive via to provide an inter-layer routing.

Example 3 includes the subject matter of any of Examples 1-2 and 4-25, wherein the at least one vertically oriented semiconductor body is a plurality of vertically oriented semiconductor bodies arranged in an array, and at least one body location of that array is filled with a conductive material to provide a via for an inter-layer routing.

Example 4 includes the subject matter of any of Examples 1-3 and 5-25, wherein the at least one vertically oriented semiconductor body is a plurality of vertically oriented semiconductor bodies arranged in an array, and at least one of those vertically oriented semiconductor bodies has been replaced with an insulating material.

Example 5 includes the subject matter of any of Examples 1-4 and 6-25, wherein the at least one vertically oriented semiconductor body is a plurality of vertically oriented semiconductor bodies arranged in an array, and at least one body location of that array is filled with an insulating material.

Example 6 includes the subject matter of any of Examples 1-5 and 9-25, wherein the at least one vertically oriented semiconductor body is a plurality of vertically oriented nanowires arranged in a regular array.

Example 7 includes the subject matter of any of Examples 1-5 and 9-25, wherein the at least one vertically oriented semiconductor body is a plurality of vertically oriented nanowires arranged in a semi-regular array.

Example 8 includes the subject matter of any of Examples 1-5 and 9-25, wherein the at least one vertically oriented semiconductor body is a plurality of vertically oriented nanowires arranged in an irregular array.

Example 9 includes the subject matter of any of Examples 1-8 and 10-25 and further includes a blanked channel adjacent to the at least one vertically oriented semiconductor body.

Example 10 includes the subject matter of any of Examples 1-9 and 11-25 and further includes a via configured to provide an electrical connection between the first interconnect and the gate layer.

Example 11 includes the subject matter of any of Examples 1-10 and 12-25 and further includes a via configured to provide an electrical connection between the third interconnect and the gate layer.

Example 12 includes the subject matter of any of Examples 1-11 and 13-25 and further includes a via configured to provide an electrical connection between the first interconnect and the third interconnect.

Example 13 includes the subject matter of any of Examples 1-12 and 14-25 and further includes a via configured to provide an electrical connection between the first interconnect, the gate layer, and the third interconnect.

Example 14 includes the subject matter of any of Examples 1-13 and 15-25, wherein the gate layer includes at least one of tungsten (W), aluminum (Al), titanium (Ti), titanium nitride (TiN), polysilicon, and/or a combination of any one or more thereof.

Example 15 includes the subject matter of any of Examples 1-14 and 16-25, wherein the at least one vertically oriented semiconductor body includes at least one of silicon (Si), germanium (Ge), silicon germanium (SiGe), gallium arsenide (GaAs), indium gallium arsenide (InGaAs), gallium nitride (GaN), indium phosphide (InP), and/or a combination of any one or more thereof.

Example 16 includes the subject matter of any of Examples 1-15 and 17-25, wherein the at least one vertically oriented semiconductor body has a length in the range of about 10-100 nm.

Example 17 includes the subject matter of any of Examples 1-16 and 18-25, wherein the at least one vertically oriented semiconductor body has a width/diameter in the range of about 1-20 nm.

Example 18 includes the subject matter of any of Examples 1-17 and 20-25, wherein the gate layer is a continuous layer having a thickness in the range of about 10-30 nm.

Example 19 includes the subject matter of any of Examples 1-17 and 20-25, wherein the gate layer is a discontinuous layer having one or more gaps therein and having a thickness in the range of about 10-30 nm.

Example 20 includes the subject matter of any of Examples 1-19 and 21-25 and further includes a dielectric layer disposed over the at least one vertically oriented semiconductor body, wherein the dielectric layer is sandwiched between the gate layer and the active channel portion of the at least one vertically oriented semiconductor body.

Example 21 includes the subject matter of Example 20, wherein the dielectric layer includes at least one of hafnium oxide ($HfO_2$), zirconium dioxide ($ZrO_2$), tantalum pentoxide ($Ta_2O_5$), silicon dioxide ($SiO_2$), aluminum oxide ($Al_2O_3$), titanium dioxide ($TiO_2$), lanthanum oxide ($La_2O_3$), hafnium silicate ($HfSiO_4$), zirconium silicate ($ZrSiO_4$), strontium titanate ($SrTiO_3$), and/or a combination of any one or more thereof.

Example 22 includes the subject matter of Example 20, wherein the dielectric layer has a thickness in the range of about 1-10 nm.

Example 23 is a memory including the subject matter of any of Examples 1-22.

Example 24 is an inverter including the subject matter of any of Examples 1-22.

Example 25 is a logic gate including the subject matter of any of Examples 1-22.

Example 26 is a method of forming an integrated circuit, the method including: providing a semiconductor layer over a first interconnect; patterning the semiconductor layer into at least one vertically oriented semiconductor body, wherein a first end of the at least one vertically oriented semiconductor body is in electronic contact with the first interconnect; forming a gate layer surrounding an active channel portion of the at least one vertically oriented semiconductor body, wherein the gate layer is configured as a second interconnect; and providing a third interconnect over the gate layer, wherein a second end of the at least one vertically oriented semiconductor body is in electronic contact with the third interconnect.

Example 27 includes the subject matter of any of Examples 26 and 28-48, wherein providing the semiconductor layer over the first interconnect includes: transferring the semiconductor layer to the first interconnect utilizing at least one of an ion-cut process, an amorphous layer blister process, a strain-induced spalling process, a backside grinding process, and/or a combination of any one or more thereof.

Example 28 includes the subject matter of any of Examples 26-27 and 29-48, wherein the semiconductor layer includes at least one of silicon (Si), germanium (Ge), silicon germanium (SiGe), gallium arsenide (GaAs), indium gallium arsenide (InGaAs), gallium nitride (GaN), indium phosphide (InP), and/or a combination of any one or more thereof.

Example 29 includes the subject matter of any of Examples 26-28 and 30-48, wherein the semiconductor layer has a thickness in the range of about 10-100 nm.

Example 30 includes the subject matter of any of Examples 26-29 and 31-48, wherein patterning the semiconductor layer into the at least one vertically oriented semiconductor body involves at least one of an immersion lithography process, an electron-beam (e-beam) lithography process, an extreme ultraviolet (EUV) lithography process, and/or a combination of any one or more thereof.

Example 31 includes the subject matter of any of Examples 26-30 and 34-48, wherein the at least one vertically oriented semiconductor body is a plurality of vertically oriented nanowires arranged in a regular array.

Example 32 includes the subject matter of any of Examples 26-30 and 34-48, wherein the at least one vertically oriented semiconductor body is a plurality of vertically oriented nanowires arranged in a semi-regular array.

Example 33 includes the subject matter of any of Examples 26-30 and 34-48, wherein the at least one vertically oriented semiconductor body is a plurality of vertically oriented nanowires arranged in an irregular array.

Example 34 includes the subject matter of any of Examples 26-33 and 35-48, wherein the at least one vertically oriented semiconductor body is a plurality of vertically oriented semiconductor bodies, and wherein prior to forming the gate layer, the method further includes: replacing at least one of the plurality of vertically oriented semiconductor bodies with a dielectric material.

Example 35 includes the subject matter of Example 34, wherein the dielectric material provides a blanked channel.

Example 36 includes the subject matter of any of Examples 26-35 and 37-48, wherein the at least one vertically oriented semiconductor body is a plurality of vertically oriented semiconductor bodies arranged in an array, and wherein the method further includes: removing at least one of those vertically oriented semiconductor bodies to provide an empty location within the array; and filling that location with a conductive material to provide a via for an inter-layer routing.

Example 37 includes the subject matter of any of Examples 26-36 and 38-48, wherein the at least one vertically oriented semiconductor body is a plurality of vertically oriented semiconductor bodies, and wherein prior to providing the third interconnect over the gate layer, the method further includes: replacing at least one of the plurality of vertically oriented semiconductor bodies with an electrically conductive material.

Example 38 includes the subject matter of Example 37, wherein the electrically conductive material provides an electrical connection between the first interconnect and the gate layer.

Example 39 includes the subject matter of Example 37, wherein the electrically conductive material provides an electrical connection between the third interconnect and the gate layer.

Example 40 includes the subject matter of Example 37, wherein the electrically conductive material provides an electrical connection between the first interconnect and the third interconnect.

Example 41 includes the subject matter of Example 37, wherein the electrically conductive material provides an electrical connection between the first interconnect, the gate layer, and the third interconnect.

Example 42 includes the subject matter of any of Examples 26-41 and 43-48, wherein the at least one vertically oriented semiconductor body is a plurality of vertically oriented semiconductor bodies arranged in an array, and wherein the method further includes: removing at least one of those vertically oriented semiconductor bodies to provide an empty location within the array; and filling that location with an insulating material.

Example 43 includes the subject matter of any of Examples 26-42 and 44-48, wherein the gate layer includes at least one of tungsten (W), aluminum (Al), titanium (Ti), titanium nitride (TiN), polysilicon, and/or a combination of any one or more thereof.

Example 44 includes the subject matter of any of Examples 26-43 and 46-48, wherein the gate layer is a continuous layer having a thickness in the range of about 10-30 nm.

Example 45 includes the subject matter of any of Examples 26-43 and 46-48, wherein the gate layer is a discontinuous layer having one or more gaps therein and having a thickness in the range of about 10-30 nm.

Example 46 includes the subject matter of any of Examples 26-45 and 47-48, wherein prior to forming the gate layer, the method further includes: forming a dielectric layer over the at least one vertically oriented semiconductor body, wherein the dielectric layer is sandwiched between the gate layer and the active channel portion of the at least one vertically oriented semiconductor body.

Example 47 includes the subject matter of Example 46, wherein the dielectric layer includes at least one of hafnium oxide ($HfO_2$), zirconium dioxide ($ZrO_2$), tantalum pentoxide ($Ta_2O_5$), silicon dioxide ($SiO_2$), aluminum oxide ($Al_2O_3$), titanium dioxide ($TiO_2$), lanthanum oxide ($La_2O_3$), hafnium silicate ($HfSiO_4$), zirconium silicate ($ZrSiO_4$), strontium titanate ($SrTiO_3$), and/or a combination of any one or more thereof.

Example 48 includes the subject matter of Example 46, wherein the dielectric layer has a thickness in the range of about 1-10 nm.

Example 49 is an integrated circuit including a first transistor device layer including: a first routing layer; a first plurality of vertically oriented semiconductor nanowires disposed over the first routing layer, wherein a first end of at least one of the first plurality of vertically oriented semiconductor nanowires is in electronic contact with the first routing layer; a first gate surrounding an active channel portion of at least one of the first plurality of vertically oriented semiconductor nanowires and configured as a first interconnect for the first transistor device layer; and a second routing layer disposed over the first gate, wherein a second end of at least one of the first plurality of vertically oriented semiconductor nanowires is in electronic contact with the second routing layer.

Example 50 includes the subject matter of any of Examples 49 and 51-60, wherein the first transistor device layer further includes a blanked channel adjacent to the first plurality of vertically oriented semiconductor nanowires.

Example 51 includes the subject matter of any of Examples 49-50 and 52-60, wherein at least one of the first plurality of vertically oriented semiconductor nanowires has been replaced with an insulating material.

Example 52 includes the subject matter of any of Examples 49-51 and 53-60, wherein the first transistor device layer further includes a via configured to provide at least one of an electrical connection between the first routing layer and the first gate, an electrical connection between the second routing layer and the first gate, an electrical connection between the first routing layer and the second routing layer, and/or an electrical connection between the first routing layer, the first gate, and the second routing layer.

Example 53 includes the subject matter of any of Examples 49-52 and 54-60, wherein at least one of the first plurality of vertically oriented semiconductor nanowires has been replaced with a conductive via to provide an inter-layer routing.

Example 54 includes the subject matter of any of Examples 49-53 and 55-60, wherein the first plurality of vertically oriented semiconductor nanowires is arranged in a regular array.

Example 55 includes the subject matter of any of Examples 49-54 and 56-60 and further includes a second transistor device layer disposed over the first transistor device layer, the second transistor device layer including: the second routing layer; a second plurality of vertically oriented semiconductor nanowires disposed over the second routing layer, wherein a first end of at least one of the second plurality of vertically oriented semiconductor nanowires is in electronic contact with the second routing layer; a second gate surrounding an active channel portion of at least one of the second plurality of vertically oriented semiconductor nanowires and configured as a second interconnect for the second transistor device layer; and a third routing layer disposed over the second gate, wherein a second end of at least one of the second plurality of vertically oriented semiconductor nanowires is in electronic contact with the third routing layer.

Example 56 includes the subject matter of Example 55, wherein the second transistor device layer further includes a blanked channel adjacent to the second plurality of vertically oriented semiconductor nanowires.

Example 57 includes the subject matter of Example 55, wherein at least one of the second plurality of vertically oriented semiconductor nanowires has been replaced with an insulating material.

Example 58 includes the subject matter of Example 55, wherein the second transistor device layer further includes a via configured to provide at least one of an electrical connection between the second routing layer and the second gate, an electrical connection between the third routing layer and the second gate, an electrical connection between the second routing layer and the third routing layer, and/or an electrical connection between the second routing layer, the second gate, and the third routing layer.

Example 59 includes the subject matter of Example 55, wherein at least one of the second plurality of vertically oriented semiconductor nanowires has been replaced with a conductive via to provide an inter-layer routing.

Example 60 includes the subject matter of any of Examples 55-59, wherein the second plurality of vertically oriented semiconductor nanowires is arranged in a regular array.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:
1. An integrated circuit comprising:
a first interconnect;
at least one vertically oriented semiconductor body over the first interconnect, wherein a first end of the at least one vertically oriented semiconductor body is in electronic contact with the first interconnect;

a gate structure surrounding channel portion of the at least one vertically oriented semiconductor body, wherein the gate structure is configured as a second interconnect;
a third interconnect over the gate structure, wherein a second end of the at least one vertically oriented semiconductor body is in electronic contact with the third interconnect; and
a via configured to provide:
an electrical connection between the first interconnect and the gate structure;
an electrical connection between the third interconnect and the gate structure;
an electrical connection between the first interconnect and the third interconnect; and/or
an electrical connection between the first interconnect, the gate structure, and the third interconnect.

2. The integrated circuit of claim 1, wherein the at least one vertically oriented semiconductor body is a plurality of vertically oriented semiconductor bodies arranged in an array, and at least one of those vertically oriented semiconductor bodies has been replaced with a conductive via to provide an inter-layer routing.

3. The integrated circuit of claim 1, wherein the at least one vertically oriented semiconductor body is a plurality of vertically oriented semiconductor bodies arranged in an array, and at least one body location of that array is filled with a conductive material to provide a via for an inter-layer routing.

4. The integrated circuit of claim 1, wherein the at least one vertically oriented semiconductor body is a plurality of vertically oriented semiconductor bodies arranged in an array, and at least one of those vertically oriented semiconductor bodies has been replaced with an insulating material.

5. The integrated circuit of claim 1, wherein the at least one vertically oriented semiconductor body is a plurality of vertically oriented semiconductor bodies arranged in an array, and at least one body location of that array is filled with an insulating material.

6. The integrated circuit of claim 1, wherein the at least one vertically oriented semiconductor body is a plurality of vertically oriented nanowires arranged in a regular array.

7. The integrated circuit of claim 1 further comprising a blanked channel adjacent to the at least one vertically oriented semiconductor body.

8. The integrated circuit of claim 1 further comprising another via different from the first via and configured to provide:
an electrical connection between the first interconnect and the gate structure;
an electrical connection between the third interconnect and the gate structure;
an electrical connection between the first interconnect and the third interconnect; and/or
an electrical connection between the first interconnect, the gate structure, and the third interconnect.

9. The integrated circuit of claim 1 further comprising a dielectric layer over the at least one vertically oriented semiconductor body, wherein the dielectric layer is also between the gate structure and the channel portion of the at least one vertically oriented semiconductor body.

10. A memory comprising the integrated circuit of claim 1.

11. An inverter comprising the integrated circuit of claim 1.

12. A logic gate comprising the integrated circuit of claim 1.

13. A method of forming an integrated circuit, the method comprising:
providing a first interconnect;
providing at least one vertically oriented semiconductor body over the first interconnect, wherein a first end of the at least one vertically oriented semiconductor body is in electronic contact with the first interconnect;
providing a gate structure surrounding a channel portion of the at least one vertically oriented semiconductor body, wherein the gate structure is configured as a second interconnect;
providing a third interconnect over the gate structure, wherein a second end of the at least one vertically oriented semiconductor body is in electronic contact with the third interconnect; and
providing a via configured to provide:
an electrical connection between the first interconnect and the gate structure;
an electrical connection between the third interconnect and the gate structure;
an electrical connection between the first interconnect and the third interconnect; and/or
an electrical connection between the first interconnect, the gate structure, and the third interconnect.

14. The method of claim 13, wherein providing the at least one vertically oriented semiconductor body over the first interconnect comprises:
transferring a semiconductor layer to the first interconnect utilizing an ion-cut process, an amorphous layer blister process, a strain-induced spalling process, a backside grinding process, and/or a combination of any one or more thereof; and
patterning the semiconductor layer into the at least one vertically oriented semiconductor body.

15. The method of claim 13 wherein the at least one vertically oriented semiconductor body is a plurality of vertically oriented semiconductor bodies and prior to providing the gate structure, the method further comprises:
replacing at least one of the plurality of vertically oriented semiconductor bodies with a dielectric material.

16. The method of claim 15, further comprising:
replacing another of the plurality of vertically oriented semiconductor bodies with a conductive material to provide another via for an inter-layer routing.

17. The method of claim 13, further comprising providing another via different from the via and configured to provide:
an electrical connection between the first interconnect and the gate structure;
an electrical connection between the third interconnect and the gate structure;
an electrical connection between the first interconnect and the third interconnect; and/or
an electrical connection between the first interconnect, the gate structure, and the third interconnect.

18. The method of claim 13, further comprising providing a dielectric layer between the gate structure and the channel portion of the at least one vertically oriented semiconductor body.

19. The method of claim 13, wherein prior to forming the gate structure, the method further comprises:
forming a dielectric layer over the at least one vertically oriented semiconductor body.

20. An integrated circuit comprising:
a first transistor device layer comprising:
a first routing layer;
a first plurality of vertically oriented semiconductor nanowires over the first routing layer, wherein a first end of at least one of the first plurality of vertically oriented semiconductor nanowires is in electronic contact with the first routing layer;
a first gate surrounding a channel portion of at least one of the first plurality of vertically oriented semiconductor nanowires and configured as a first interconnect for the first transistor device layer;
a second routing layer over the first gate, wherein a second end of at least one of the first plurality of vertically oriented semiconductor nanowires is in electronic contact with the second routing layer; and
a via configured to provide at least one of:
an electrical connection between the first routing layer and the first gate;
an electrical connection between the second routing layer and the first gate;
an electrical connection between the first routing layer and the second routing layer; and/or
an electrical connection between the first routing layer, the first gate, and the second routing layer.

21. The integrated circuit of claim 20, wherein the first transistor device layer further comprises:
a blanked channel adjacent to the first plurality of vertically oriented semiconductor nanowires.

22. The integrated circuit of claim 20, wherein at least one of the first plurality of vertically oriented semiconductor nanowires has been replaced with an insulating material or a conductive via to provide an inter-layer routing.

23. The integrated circuit of claim 20 further comprising:
a second transistor device layer over the first transistor device layer, the second transistor device layer comprising:
the second routing layer;
a second plurality of vertically oriented semiconductor nanowires over the second routing layer, wherein a first end of at least one of the second plurality of vertically oriented semiconductor nanowires is in electronic contact with the second routing layer;
a second gate surrounding a channel portion of at least one of the second plurality of vertically oriented semiconductor nanowires and configured as a second interconnect for the second transistor device layer; and
a third routing layer over the second gate, wherein a second end of at least one of the second plurality of vertically oriented semiconductor nanowires is in electronic contact with the third routing layer.

24. The integrated circuit of claim 23, wherein the second transistor device layer further comprises:
a blanked channel adjacent to the second plurality of vertically oriented semiconductor nanowires; and/or
a via configured to provide:
an electrical connection between the second routing layer and the second gate;
an electrical connection between the third routing layer and the second gate;
an electrical connection between the second routing layer and the third routing layer; and/or
an electrical connection between the second routing layer, the second gate, and the third routing layer.

25. The integrated circuit of claim 23, wherein at least one of the second plurality of vertically oriented semiconductor nanowires has been replaced with an insulating material or a conductive via to provide an inter-layer routing.

* * * * *

UNITED STATES PATENT AND TRADEMARK OFFICE
CERTIFICATE OF CORRECTION

PATENT NO. : 10,043,797 B2
APPLICATION NO. : 15/124808
DATED : August 7, 2018
INVENTOR(S) : Jun et al.

Page 1 of 1

It is certified that error appears in the above-identified patent and that said Letters Patent is hereby corrected as shown below:

In Claim 20, Column 27, Line 12, please replace:
"a via configured to provide at least one of:"
With:
--a via configured to provide:--

Signed and Sealed this
Ninth Day of October, 2018

Andrei Iancu
*Director of the United States Patent and Trademark Office*